(12) United States Patent
Lee et al.

(10) Patent No.: US 12,311,961 B2
(45) Date of Patent: May 27, 2025

(54) ELECTRONIC DEVICE INCLUDING MONITORING CIRCUIT OF RAMP SIGNAL AND OPERATING METHOD THEREOF

(71) Applicant: SAMSUNG ELECTRONICS CO., LTD., Suwon-si (KR)

(72) Inventors: Minwoo Lee, Hwaseong-si (KR); Seongyeop Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 433 days.

(21) Appl. No.: 17/679,261

(22) Filed: Feb. 24, 2022

(65) Prior Publication Data

US 2022/0266845 A1 Aug. 25, 2022

(30) Foreign Application Priority Data

Feb. 25, 2021 (KR) .................. 10-2021-0025967

(51) Int. Cl.
*B60W 50/02* (2012.01)
*B60W 50/00* (2006.01)
*B60W 60/00* (2020.01)
*H03K 4/08* (2006.01)
*H04N 17/00* (2006.01)
*H04N 25/75* (2023.01)

(52) U.S. Cl.
CPC ...... *B60W 50/0205* (2013.01); *B60W 60/001* (2020.02); *H03K 4/08* (2013.01); *H04N 17/002* (2013.01); *H04N 25/75* (2023.01); *B60W 2050/0047* (2013.01)

(58) Field of Classification Search
None
See application file for complete search history.

(56) References Cited

U.S. PATENT DOCUMENTS

| 4,335,373 A | 6/1982 | Sloane | |
| 7,265,530 B1* | 9/2007 | Broach | H02M 3/156 324/117 R |
| 9,851,416 B2 | 12/2017 | Scheller et al. | |
| 10,498,993 B1* | 12/2019 | Ebihara | H04N 25/772 |
| 10,659,707 B2 | 5/2020 | Oka et al. | |
| 10,788,826 B2 | 9/2020 | Fukuda et al. | |

(Continued)

FOREIGN PATENT DOCUMENTS

| CN | 110710197 A * | 1/2020 | ......... H03F 3/45273 |
| JP | 2015161593 | 9/2015 | |

(Continued)

OTHER PUBLICATIONS

CN110710197A translation (Year: 2020).*
Translation of Korean Office Action (Year: 2025).*

*Primary Examiner* — Lina Cordero
(74) *Attorney, Agent, or Firm* — MORGAN, LEWIS & BOCKIUS LLP

(57) ABSTRACT

An electronic device includes a ramp generator configured to generate a ramp signal used to detect data, the ramp signal increasing or decreasing with a certain slope; a main circuit configured to perform at least one predefined function by detecting the data based on the ramp signal; a monitoring circuit configured to output a verify signal indicating whether the ramp signal is faulty; and a controller configured to control execution of the at least one predefined function based on the verify signal.

17 Claims, 22 Drawing Sheets

(56) References Cited

U.S. PATENT DOCUMENTS

| | | | |
|---|---|---|---|
| 2009/0066826 A1* | 3/2009 | Gelfand | H04N 25/772 |
| | | | 348/308 |
| 2009/0174442 A1* | 7/2009 | Kim | H04N 25/709 |
| | | | 327/134 |
| 2020/0344432 A1 | 10/2020 | Sakakibara | |
| 2022/0173745 A1* | 6/2022 | Kim | H03M 1/0845 |

FOREIGN PATENT DOCUMENTS

| | | |
|---|---|---|
| JP | 2017033236 | 2/2017 |
| JP | 2020109674 | 7/2020 |
| KR | 10-2009-0069803 A | 7/2009 |
| KR | 10-2017-0032336 A | 3/2017 |
| KR | 10-1876517 | 7/2018 |
| KR | 10-2019-0092620 A | 8/2019 |
| KR | 1020200106155 | 9/2020 |

* cited by examiner

ELECTRONIC DEVICE INCLUDING MONITORING CIRCUIT OF RAMP SIGNAL AND OPERATING METHOD THEREOF

CROSS-REFERENCE TO RELATED APPLICATION

This application is based on and claims priority under 35 U.S.C. § 119 to Korean Patent Application No. 10-2021-0025967, filed on Feb. 25, 2021 in the Korean Intellectual Property Office, the disclosure of which is incorporated by reference herein in its entirety.

TECHNICAL FIELD

Example embodiments of the inventive concept relate to an electronic device, and more particularly, to an electronic device including a monitoring circuit of a ramp signal and an operating method of the electronic device.

DISCUSSION OF RELATED ART

A ramp signal increases or decreases with a certain slope. Sensors may sample a sensing signal from an object using a ramp signal. For example, image sensors may convert an electrical signal generated by a photosensitive element into a digital value by sampling the electrical signal based on a ramp signal.

A monitoring circuit may be used to detect an abnormal operation of an electronic component. For example, when an abnormal operation occurs in an electronic component of an automobile, it may cause a serious issue to user safety. Accordingly, a monitoring circuit may be used to detect an abnormal operation of an electronic component.

SUMMARY

Example embodiments of the inventive concept provide a monitoring circuit for providing fault occurrence information to a system by detecting a fault in a functional unit, and an operating method thereof.

According to an aspect of the inventive concept, there is provided an electronic device including a ramp generator configured to generate a ramp signal used to detect data, the ramp signal increasing or decreasing with a certain slope; a main circuit configured to perform at least one predefined function by detecting the data based on the ramp signal; a monitoring circuit configured to output a verify signal indicating whether the ramp signal is faulty; and a controller configured to control execution of the at least one predefined function based on the verify signal.

According to an aspect of the inventive concept, there is provided an image sensor including a pixel array including a plurality of pixels, a ramp generator configured to generate a ramp signal, a readout circuit configured to compare the ramp signal with a pixel signal output from the pixel array and convert the pixel signal into a digital pixel value, a controller configured to control the ramp generator and the readout circuit, and a monitoring circuit configured to measure a slope of the ramp signal and output whether the ramp generator is faulty to the controller.

According to an aspect of the inventive concept, there is provided an operating method of an electronic device. The operating method includes receiving a ramp signal; calculating a slope of the ramp signal; comparing the slope with at least one reference value; discriminating whether the ramp signal is faulty according to a comparison result; and stopping an operation mode as the ramp signal is faulty, the operation mode being based on the ramp signal.

BRIEF DESCRIPTION OF THE DRAWINGS

Example embodiments of the inventive concept will be more clearly understood from the following detailed description taken in conjunction with the accompanying drawings, in which.

DETAILED DESCRIPTION OF THE EMBODIMENTS

Figure 1:
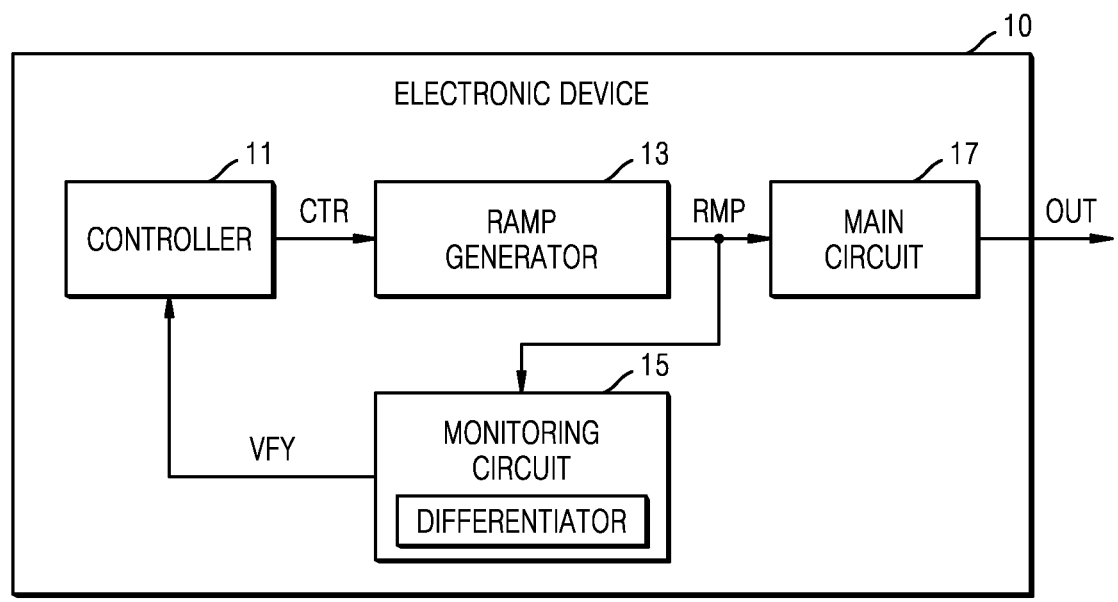
FIG. 1 is a block diagram of an electronic device according to an example embodiment.

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a block diagram of an electronic device 10 according to an example embodiment. The electronic device 10 may refer to any device that is configured to perform an intended function using electric energy and may be referred to as an electrical system. For example, the electronic device 10 may include a semiconductor chip manufactured through semiconductor processes, a module including at least one semiconductor chip mounted on a board and a substrate, or at least two modules communicating with each other. The electronic device 10 may correspond to a unit, such as a mobile phone, which is independently used, or a component of a whole system such as an automobile. As shown in FIG. 1, the electronic device 10 may include, for example, a controller 11, a ramp generator 13, a monitoring circuit 15, and a main circuit 17.

The controller 11 may control general operations of the electronic device 10. For example, the controller 11 may output control signals for controlling functional units of the electronic device 10 such that functionality for which the electronic device 10 is designed may be provided.

According to an example embodiment, the controller 11 may control the ramp generator 13. For example, the controller 11 may provide the ramp generator 13 with a control signal CTR for controlling the amplitude, duty ratio, application time, or the like of a signal generated by the ramp generator 13 such that a ramp signal RMP utilized by the electronic device 10 is provided to be suitable for the purpose for which each functional unit is designed.

According to an example embodiment, the control signal CTR generated by the controller 11 may include a power signal, a preset signal, a reset signal, a monitoring signal, and/or a power-down signal. A power signal PWR, a preset signal PRST, a reset signal RST, a monitoring signal MNT, and a power-down signal PD will be described with reference to FIGS. 3 and 6.

The controller 11 may include, for example, a central processing unit (CPU), an arithmetic logic unit (ALU) performing arithmetic and logical operations, bit shift, or the like, a digital signal processor (DSP), a microprocessor, an application specific integrated circuit (ASIC), a control logic, or the like, but is not limited thereto. In some embodiments, the controller 11 may include a state machine including a plurality of logic gates or may include a processor and a memory storing instructions executed by the processor.

The ramp generator 13 may generate the ramp signal RMP, which gradually increases or decreases with a certain slope. According to an example embodiment, the ramp generator 13 may generate the ramp signal RMP, which has a certain slope, a certain ramping time, a certain ramping start voltage level, and/or a certain ramping end voltage level, in response to the control signal CTR. The ramp generator 13 may have a complex structure such as, for example, a digital-to-analog converter, or a more simplified structure such as the structure described below with reference to FIGS. 4A and 4B to generate the ramp signal RMP.

The ramp signal RMP gradually increases or decreases with a certain magnitude. The electronic device 10 that may provide a function of sensing an object or digitizing an analog signal may generate the ramp signal RMP such that a signal or data of a sensed object may be sampled and a sampled signal or data in analog form may be converted into digital information.

The ramp signal RMP may include a reset ramping period for a reset and a signal ramping period for signal sensing. For example, when the ramp signal RMP is used for correlated double sampling (CDS), the ramp signal RMP may sequentially have a reset ramping period and a signal ramping period.

A single ramping period of the ramp signal RMP or a sequence of a reset ramping period and a signal ramping period of the ramp signal RMP may be processed as a single unit. According to an example embodiment, when the ramp signal RMP is used for CDS, the ramp signal RMP having a single ramping period or the ramp signal RMP sequentially having a reset ramping period and a signal ramping period may be used for sampling with respect to a single image frame. Sampling with respect to an image frame may be performed row by row. For example, the electronic device 10 may perform sampling on a first row of an image frame using a ramping period and then perform sampling on a second row of the image frame using another ramping period. Sampling with respect to an image frame may be performed row by row from top to bottom, but is not limited thereto.

The main circuit 17 may provide at least one function of the electronic device 10 or the main function of the electronic device 10. The main circuit 17 may output a function of the electronic device 10 to the outside of the electronic device 10 as an output signal OUT. For example, the main circuit 17 may include an analog circuit, such as an analog filter or an amplifier, a digital circuit processing a digital signal, or a circuit such as an analog-to-digital converter or a digital-to-analog converter, which processes a mixed signal.

According to an example embodiment, the main circuit 17 may perform a predefined function by detecting data based on the ramp signal RMP. For example, the main circuit 17 may include a CDS circuit, which performs CDS on data based on the ramp signal RMP, or an analog-to-digital converter circuit including a CDS function. Besides the above, the main circuit 17 may provide various functions using the ramp signal RMP that gradually increases or decreases with a certain slope. According to an example embodiment, the main circuit 17 may have a tolerance range or a normal operation range, in which the main circuit 17 normally operates even when the slope of the ramp signal RMP is changed. The tolerance range may vary with the function of the main circuit 17.

Hereinafter, the main circuit 17 may be described as a circuit, which provides the main function of the electronic device 10 based on the ramp signal RMP generated by the ramp generator 13, but embodiments are not limited thereto.

The main circuit 17 may not normally perform a designed function because of, for example, a defect occurring during the manufacture of the electronic device 10, deterioration due to ageing of another functional unit such as the ramp signal RMP providing a signal to the main circuit 17, or an external impact on the electronic device 10. When a signal (e.g., the ramp signal RMP) provided to the main circuit 17 is not normal, an error of the electronic device 10 and an error of a system including the electronic device 10 may occur. For example, when the electronic device 10 is included in an automobile and performs necessary functions for driving (e.g., autonomous driving), an error of the electronic device 10 may cause a serious problem.

To manage a functional error of the main circuit 17 (or the electronic device 10), international standards may be defined, and the electronic device 10 may be designed to comply with the international standards. For example, ISO 26262 is defined by the International Standard Organization (ISO) and may be titled "Road vehicles-Functional safety".

ISO 26262 may define various requirements for general development processes for functional safety of electrical and/or electronic (E/E) systems that are installed in automobiles. For example, ISO 26262 may require E/E systems to meet the requirements of an automotive safety integrity level (ASIL). According to the ASIL, hazardous events related to an automobile are assessed in terms of three hazardous effects, e.g., exposure, the severity of injuries, and controllability, and the ASIL is assessed by summing scores respectively allocated to the hazardous effects. In other words, to meet the requirements of the ASIL of ISO 26262, the monitoring circuit 15, which monitors the main circuit 17 at all times, may be utilized in example embodiments.

The monitoring circuit 15 may monitor whether a signal provided to the main circuit 17 is normal. For example, as shown in FIG. 1, the monitoring circuit 15 may monitor whether the ramp signal RMP output from the ramp generator 13 operates in a normal range and may generate a verify signal VFY as a monitoring result. For example, when the ramp signal RMP does not normally operate, the monitoring circuit 15 may generate, as the verify signal VFY, a flag indicating a fault. For example, when the ramp signal RMP operates normally, the monitoring circuit 15 may generate, as the verify signal VFY, a flag indicating normal operation.

The controller 11 may check the flag of the verify signal VFY and stop an operation mode, which is based on a signal provided to the main circuit 17, because the signal provided to the main circuit 17 is faulty. According to an example embodiment, when the controller 11 receives a fault flag as the verify signal VFY, the controller 11 may identify that the ramp signal RMP does not operate in a normal range. Accordingly, the controller 11 may stop the operation mode of the main circuit 17, which operates based on the ramp signal RMP. For example, the electronic device 10 may provide an autonomous driving function, and the main circuit 17 may correspond to an image sensor, which performs CDS based on the ramp signal RMP, or a readout circuit of the image sensor. The controller 11 may receive the verify signal VFY indicating that the ramp signal RMP is beyond a normal range and thus convert an autonomous driving mode into a manual driving mode, and accordingly, safety for a user of the electronic device 10 may be secured.

In some embodiments, differently from the illustration of FIG. 1, the verify signal VFY may be provided to the outside of the electronic device 10 instead of the inside of the electronic device 10. Accordingly, necessary follow-up measures may be appropriately taken based on the verify signal VFY when the electronic device 10 does not normally operate.

According to an example embodiment, the monitoring circuit 15 may include a differentiator. For example, the monitoring circuit 15 may immediately monitor whether the ramp signal RMP is provided to the main circuit 17 in a normal range by differentiating the ramp signal RMP with respect to time, wherein the ramp signal RMP gradually increases or decreases with a certain slope. Implementation of the monitoring circuit 15 including a differentiator will be described with reference to FIGS. 2 and 3 below.

As described above, when the electronic device 10 is applied to an automobile and various signals for the appropriate function of the electronic device 10 are not provided in normal ranges, a serious issue to user safety may be caused due to the characteristics of an automobile. Accordingly, it may be important to immediately detect the abnormal operation of an electronic component. According to an example embodiment, the monitoring circuit 15 may accurately monitor another functional unit (e.g., the ramp generator 13), which provides the function of the electronic device 10, and accordingly, the reliability of the electronic device 10 may be increased. According to an example embodiment, the monitoring circuit 15 may immediately detect a fault occurring in the electronic device 10 and stop an operation mode using a functional unit having the fault, and accordingly, the safety of a system user may be increased.

Figure 2:
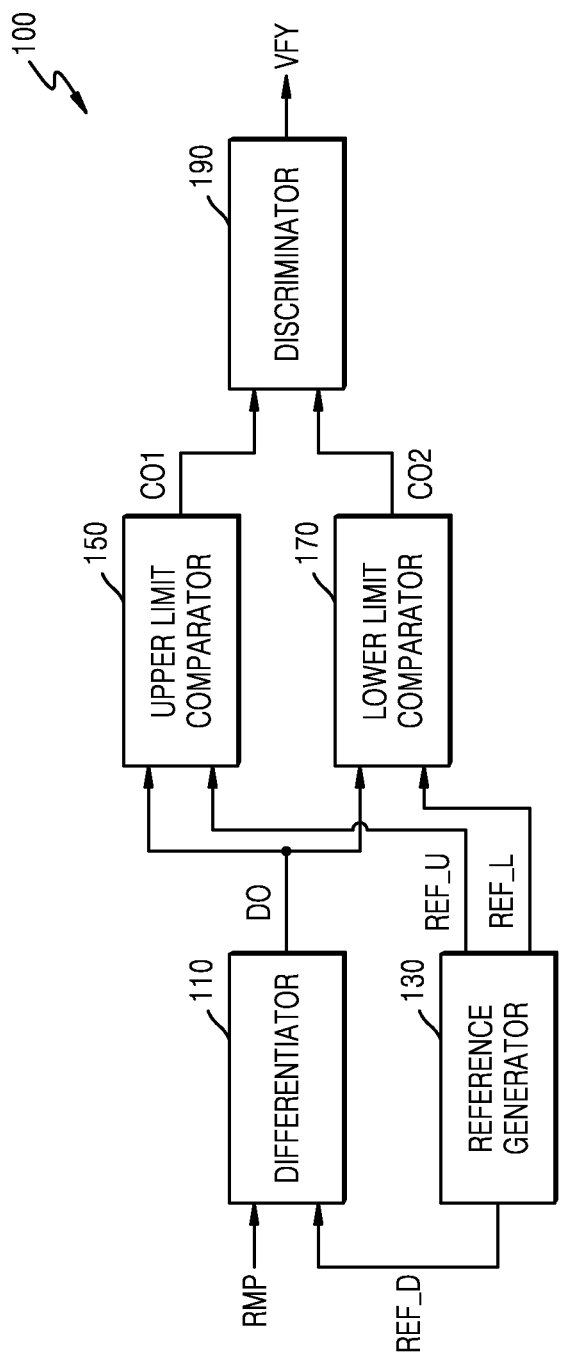
FIG. 2 is a block diagram of a monitoring circuit according to an example embodiment.

FIG. 2 is a block diagram of a monitoring circuit 100 according to an example embodiment. Hereinafter, redundant descriptions will be omitted.

Referring to FIG. 2 together with FIG. 1, the monitoring circuit 100 may include a differentiator 110, a reference generator 130, an upper limit comparator 150, a lower limit comparator 170, and a discriminator 190.

The differentiator 110 may perform a differential operation on the ramp signal RMP based on the ramp signal RMP and a differential reference value REF_D and generate a differential output DO as the result of the differential operation.

According to an example embodiment, the differentiator 110 may differentiate the ramp signal RMP with respect to time. For example, the differentiator 110 may perform a differential operation on the ramp signal RMP, which is a voltage (or current) signal gradually increasing or decreasing with a certain slope, with respect to time. The differentiator 110 may generate the differential output DO, which includes a value of the slope of the ramp signal RMP, by differentiating the ramp signal RMP having downward ramping or upward ramping with a certain slope. The differential output DO may be provided to the upper limit comparator 150 and the lower limit comparator 170.

According to an example embodiment, the reference generator 130 may provide the differentiator 110 with the differential reference value REF_D for a differential operation. For example, the differentiator 110 may be implemented as an operational amplifier. At this time, the differentiator 110 may receive a target signal (e.g., the ramp signal RMP) to be differentiated and a reference value for a differential operation through two input terminals. Although it has been described that the differentiator 110 is implemented as an operational amplifier for convenience of description, example embodiments are not limited thereto, and the differentiator 110 may provide a similar function as any one of various kinds of analog circuits, digital circuits, and combinations thereof.

The reference generator 130 may generate an upper reference value REF_U and a lower reference value REF_L in addition to the differential reference value REF_D. According to example embodiments, the reference generator 130 may generate various reference signals utilized for the driving of the electronic device 10 of FIG. 1 based on a control signal from the controller 11 in FIG. 1. For example, the reference generator 130 may generate a voltage (or current) signal having a certain magnitude and a clock signal toggling at certain intervals.

The upper reference value REF_U and the lower reference value REF_L may be predetermined. According to an example embodiment, the upper reference value REF_U and the lower reference value REF_L may be preset during the manufacture of the electronic device 10 or predefined by a user or may be certain values predetermined by referring to a register stored in a memory. The reference generator 130 may generate reference signals in correspondence with the upper reference value REF_U and the lower reference value REF_L. In other words, the reference generator 130 may generate reference signals having a magnitude substantially close to the upper reference value REF_U or the lower reference value REF_L and provide the reference signals to other functional units (e.g., the upper limit comparator 150 and the lower limit comparator 170).

The upper limit comparator 150 may compare the differential output DO with the upper reference value REF_U and generate a first comparison output CO1 as a comparison result. The lower limit comparator 170 may compare the differential output DO with the lower reference value REF_L and generate a second comparison output CO2 as a comparison result. The first comparison output CO1 and the second comparison output CO2 may be provided to the discriminator 190.

According to an example embodiment, each of the upper limit comparator 150 and the lower limit comparator 170 may be implemented as an operational amplifier and may compare two signals provided through two input terminals. For example, the upper limit comparator 150 may subtract the magnitude of the differential output DO from the upper reference value REF_U and output a subtraction result as the first comparison output CO1, and the lower limit comparator 170 may subtract the lower reference value REF_L from the magnitude of the differential output DO. However, embodiments are not limited to the arithmetic operation described above.

The main circuit 17 in FIG. 1 or an electronic component of the electronic device 10 may have a tolerance range (or a normal operation range), in which the main circuit 17 normally operates even when the slope of the ramp signal RMP is changed. The tolerance range may vary with a function provided by the electronic component or the main circuit 17. For example, with respect to the ramp signal RMP used by the main circuit 17, a recommended slope for an optimal operation and a tolerance range for allowing the function of the main circuit 17 to be normally provided even when the slope of the ramp signal RMP is partially changed may be predetermined.

According to an example embodiment, the upper reference value REF_U may correspond to the upper limit of a tolerance range for the slope change of the ramp signal RMP utilized for an electronic component, and the lower reference value REF_L may correspond to the lower limit of a tolerance range for the slope change of the ramp signal RMP utilized for an electronic component. For example, in an example embodiment, the upper reference value REF_U may be substantially the same as two times a recommended slope of the ramp signal RMP, and the lower reference value REF_L may be substantially the same as ½ of the recommended slope of the ramp signal RMP. However, these approximations (two times and ½) are specified for convenience of description, and example embodiments are not limited to these approximations. For example, in an example embodiment, the upper reference value REF_U may be 1.5 times or three times the recommended slope for the proper operation of the main circuit 17. The recommended slope of the ramp signal RMP may also be referred to herein as a normal slope of the ramp signal RMP.

The discriminator 190 may discriminate whether the ramp signal RMP is faulty based on the first comparison output CO1 and the second comparison output CO2, which are respectively provided from the upper limit comparator 150 and the lower limit comparator 170. Herein, the terms "discriminate" and "determine" may be used interchangeably. According to an example embodiment, the discriminator 190 may discriminate whether the ramp signal RMP exceeds the upper reference value REF_U based on a signal level of the first comparison output CO1 and discriminate whether the ramp signal RMP is below the lower reference value REF_L based on a signal level of the second comparison output CO2. For example, assuming that the first comparison output CO1 is a result of subtracting the magnitude of the differential output DO from the upper reference value REF_U as described above, the discriminator 190 may discriminate a normal operation in a normal range, in which the slope of the ramp signal RMP does not exceed the upper reference value REF_U, when the value of the first comparison output CO1 is a positive number, from a faulty operation, in which the slope of the ramp signal RMP exceeds the upper reference value REF_U, when the value of the first comparison output CO1 is a negative number. Similarly, assuming that the second comparison output CO2 is a result of subtracting the lower reference value REF_L from the magnitude of the differential output DO as described above, the discriminator 190 may discriminate a normal operation in a normal range, in which the slope of the ramp signal RMP is not below the lower reference value REF_L, when the value of the second comparison output CO2 is a positive number, from a faulty operation, in which the slope of the ramp signal RMP is below the lower reference value REF_L, when the value of the second comparison output CO2 is a negative number. The discriminator 190 will be described in detail with reference to FIGS. 3 and 5.

The discriminator 190 may generate the verify signal VFY as a result of discriminating the normal operation from the faulty operation. According to an example embodiment, the verify signal VFY may indicate a fault or normality of the ramp signal RMP. For example, the verify signal VFY may include a fault flag when the ramp signal RMP is faulty and include a normal flag when the ramp signal RMP is normal. According to an example embodiment, the verify signal VFY may be provided to a controller (e.g., the controller 11 in FIG. 1) managing the electronic device 10 such that the function of the electronic device 10 based on the ramp signal RMP may be maintained or stopped. For example, the verify signal VFY including a fault flag may be provided to an electronic control unit (ECU), a CPU, or a driving controller of an autonomous driving vehicle such that the autonomous driving mode of the vehicle may be stopped.

Figure 3:
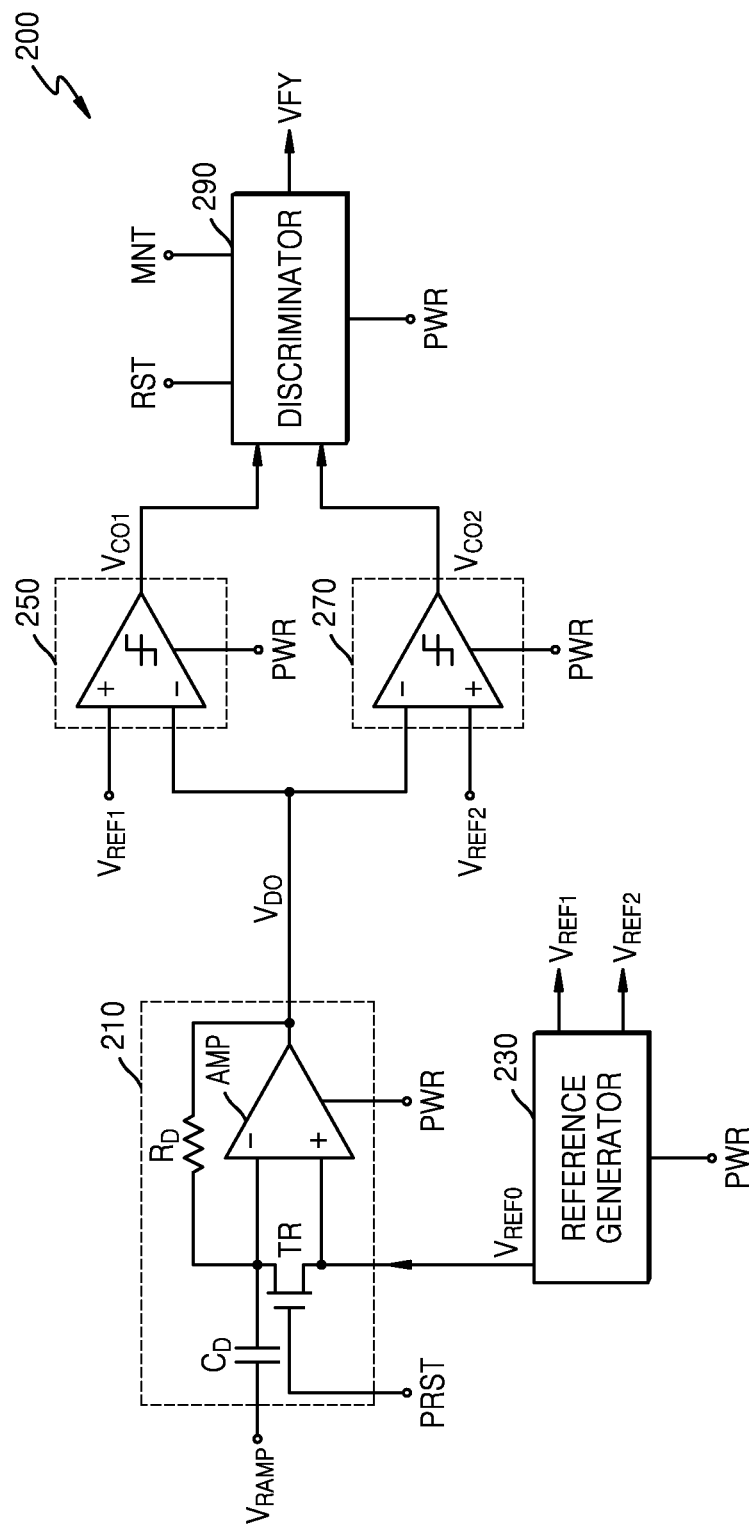
FIG. 3 is a detailed circuit diagram of a monitoring circuit according to an example embodiment.

FIG. 3 is a detailed circuit diagram of a monitoring circuit 200 according to an example embodiment.

Referring to FIG. 3 together with FIG. 2, the monitoring circuit 200 may include a differentiator 210, a reference generator 230, an upper limit comparator 250, a lower limit comparator 270, and a discriminator 290. Hereinafter, redundant descriptions given with reference to FIGS. 1 and 2 will be omitted for convenience of explanation.

When the differentiator 210 is implemented by a combination of an operational amplifier, the differentiator 210 may include an amplifier AMP, a resistor $R_D$, and a capacitor $C_D$. The amplifier AMP may receive input signals through a positive input terminal and a negative input terminal, and a power signal PWR may be provided to the body of the amplifier AMP. As the power signal PWR is turned on (e.g., transitions to logic high), the amplifier AMP starts to operate.

The capacitor $C_D$ and the resistor $R_D$ may be coupled to the negative input terminal of the amplifier AMP. According to an example embodiment, a ramp voltage VRAMP as the ramp signal RMP in FIG. 2 may be applied to the other end of the capacitor $C_D$, and an output terminal of the amplifier AMP may be coupled to the other end of the resistor $R_D$.

A zeroth reference voltage $V_{REF0}$ generated by the reference generator 230 may be applied to the positive input terminal of the amplifier AMP. The zeroth reference voltage $V_{REF0}$ may be a voltage signal, which has a certain voltage level corresponding to the differential reference value REF_D in FIG. 2.

According to an example embodiment, a switch, which is closed and opened by a preset signal PRST, may be connected between the positive and negative input terminals of the amplifier AMP. For example, referring to FIG. 3, the source and drain terminals of a transistor TR, which is an example implementation of a switch, may be respectively connected to the positive and negative input terminals of the amplifier AMP, and the preset signal PRST may be applied to the gate terminal of the transistor TR.

When the preset signal PRST turns on a switch (e.g., the transistor TR), the positive and negative input terminals of the amplifier AMP may be short-circuited, and voltages applied to the amplifier AMP may be the same between the positive and negative input terminals of the amplifier AMP. According to an example embodiment, the amplifier AMP, which may be implemented as an operational amplifier, may amplify a difference between a voltage applied through the positive input terminal and a voltage applied through the negative input terminal by a gain. When substantially the same voltages are respectively applied to the positive and negative input terminals of the amplifier AMP, the transconductance of the amplifier AMP may be relatively very high, and accordingly, the transient state of a signal involved in the application of the ramp voltage VRAMP may be relatively quickly stabilized. An operation, in which the differentiator 210 is quickly stabilized with the turn-on of the preset signal PRST, may be referred to as a preset operation. A period, in which the preset signal PRST is in a turn-on state, may be referred to as a preset period. The preset period will be described in detail with reference to FIG. 6.

The differentiator 210 may calculate a slope of the ramp voltage $V_{RAMP}$ received through the input terminal by differentiating the ramp voltage $V_{RAMP}$ with respect to time and generate a differential output voltage $V_{DO}$ having a voltage level corresponding to the slope. The differential output voltage $V_{DO}$ may be provided to the upper limit comparator 250 and the lower limit comparator 270.

The reference generator 230 may generate the zeroth reference voltage $V_{REF0}$, a first reference voltage $V_{REF1}$, and a second reference voltage $V_{REF2}$. According to an example embodiment, the zeroth reference voltage $V_{REF0}$ may be provided to the amplifier AMP as described above, the first reference voltage $V_{REF1}$ may be provided to the upper limit comparator 250, and the second reference voltage $V_{REF2}$ may be provided to the lower limit comparator 270. The power signal PWR may be provided to the reference generator 230 through one terminal thereof.

Each of the upper limit comparator 250 and the lower limit comparator 270 may receive the differential output voltage $V_{DO}$ through an input terminal and the first reference voltage $V_{REF1}$ or the second reference voltage $V_{REF2}$ through another input terminal. For example, the upper limit comparator 250 may receive the first reference voltage $V_{REF1}$ through a positive input terminal thereof and the differential output voltage $V_{DO}$ through a negative input terminal thereof. The upper limit comparator 250 may perform subtraction on the first reference voltage $V_{REF1}$ and the differential output voltage $V_{DO}$ and generate a first comparison output voltage $V_{CO1}$ as a subtraction result. Similarly, the lower limit comparator 270 may receive the second reference voltage $V_{REF2}$ through a positive input terminal thereof and the differential output voltage $V_{DO}$ through a negative input terminal thereof. The lower limit comparator 270 may perform subtraction on the differential output voltage $V_{DO}$ and the second reference voltage $V_{REF2}$ and generate a second comparison output voltage $V_{CO2}$ as a subtraction result. The power signal PWR may be provided to the body of each of the upper limit comparator 250 and the lower limit comparator 270. As the power signal PWR is turned on (e.g., transitions to logic high), the upper limit comparator 250 and the lower limit comparator 270 may start to operate.

As the power signal PWR is turned on (e.g., transitions to logic high), the discriminator 290 may also start to operate. A reset signal RST may be applied to the discriminator 290 through a terminal thereof. When the reset signal RST is turned on, discrimination may be performed on the first comparison output voltage $V_{CO1}$ and the second comparison output voltage $V_{CO2}$.

The discriminator 290 may receive the first comparison output voltage $V_{CO1}$ and the second comparison output voltage $V_{CO2}$ and discriminate whether the ramp voltage $V_{RAMP}$ is faulty. According to an example embodiment, the discriminator 290 may determine that the ramp voltage $V_{RAMP}$ is normal when identifying that the first comparison output voltage $V_{CO1}$ is greater than a reference value and determine that the ramp voltage $V_{RAMP}$ is faulty when identifying that the first comparison output voltage $V_{CO1}$ is less than the reference value. Similarly, the discriminator 290 may determine that the ramp voltage $V_{RAMP}$ is normal when identifying that the second comparison output voltage $V_{CO2}$ is greater than the reference value and determine that the ramp voltage $V_{RAMP}$ is faulty when identifying that the second comparison output voltage $V_{CO2}$ is less than the reference value. For example, the reference value may be 0 but may vary with use environments of the electronic device 10, conditions, user settings, initial values, etc.

A monitoring signal MNT may be applied to the discriminator 290 through a terminal thereof. During the turn-on period of the monitoring signal MNT, the discriminator 290 may output a result of determining the ramp voltage $V_{RAMP}$ based on the first comparison output voltage $V_{CO1}$ and/or the second comparison output voltage $V_{CO2}$. For example, during the turn-on period of the monitoring signal MNT, the discriminator 290 may discriminate whether the ramp voltage $V_{RAMP}$ is normal and generate and output the verify signal VFY as a determination result. The turn-on period of the monitoring signal MNT may be referred to as a monitoring period. The monitoring period will be described in detail with reference to FIG. 6.

According to an example embodiment, during the monitoring period, the discriminator 290 may determine that the ramp voltage $V_{RAMP}$ is faulty when the first comparison output voltage $V_{CO1}$ or the second comparison output voltage $V_{CO2}$ is less than the reference value and generate the verify signal VFY including a fault flag. According to an example embodiment, the discriminator 290 may determine that the ramp voltage $V_{RAMP}$ is normal when both the first comparison output voltage $V_{CO1}$ and the second comparison output voltage $V_{CO2}$ are greater than the reference value and generate the verify signal VFY including a normal flag.

Figure 4A:
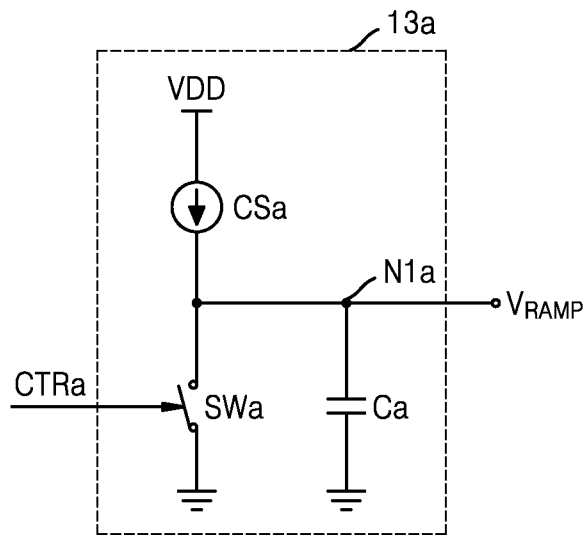
FIGS. 4A through 4C are circuit diagrams of examples of a ramp generator, according to example embodiments.
Figure 4B:
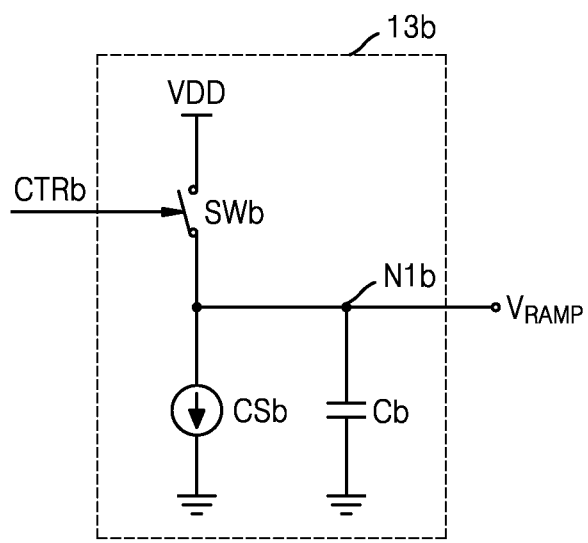
Figure 4C:
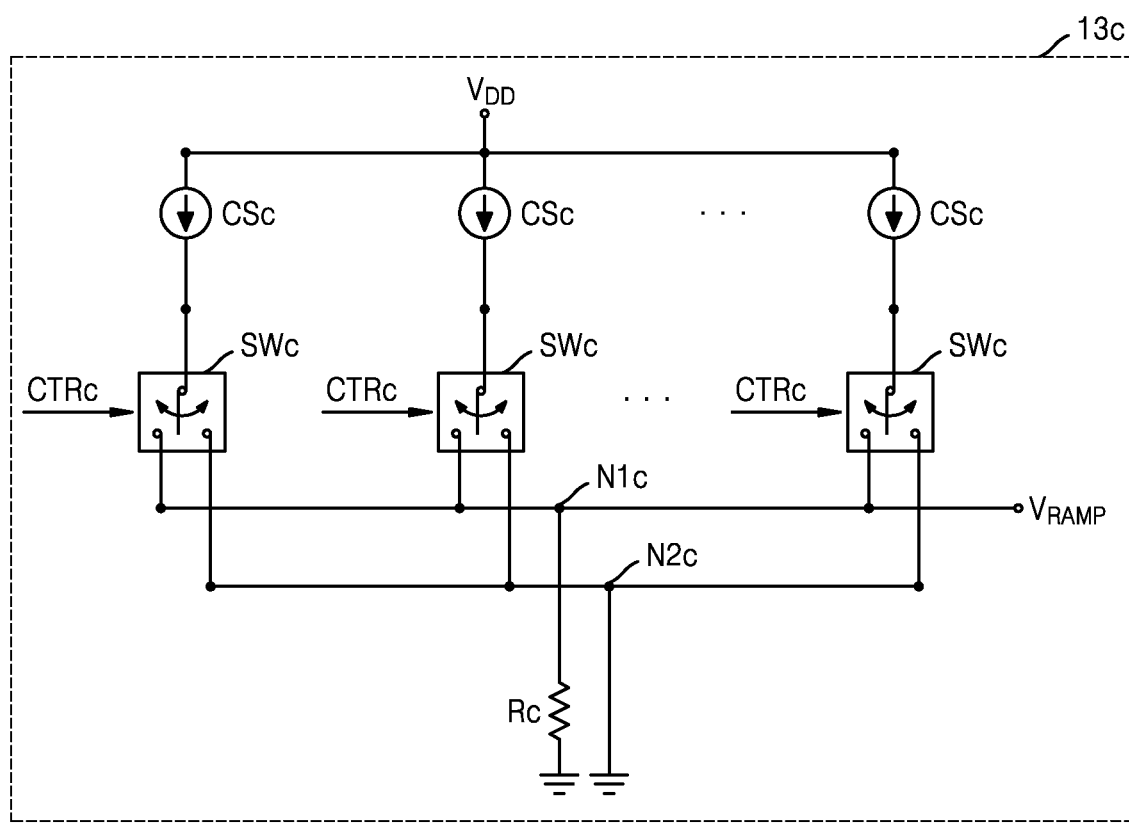

FIGS. 4A through 4C are circuit diagrams of examples of the ramp generator 13, according to example embodiments. In detail, FIG. 4A shows a ramp generator 13a generating the ramp voltage $V_{RAMP}$ that gradually increases, and FIG. 4B shows a ramp generator 13b generating the ramp voltage $V_{RAMP}$ that gradually decreases. FIG. 4C shows a ramp generator 13c generating the ramp voltage $V_{RAMP}$ that gradually increases or decreases. The ramp generators 13a, 13b, and 13c of respective FIGS. 4A, 4B, and 4C may be example implementations of the ramp generator 13 in FIG. 1, and redundant descriptions thereof are omitted below for convenience of explanation.

Referring to FIG. 4A, the ramp generator 13a may include a current source CSa, a switch SWa, and a capacitor Ca. The current source CSa may provide constant current to a first node N1a from a positive supply voltage $V_{DD}$. The switch SWa and the capacitor Ca may be connected in parallel between the first node N1a and a ground node. The switch SWa may be turned on or off according to a control signal CTRa and may include transistors, which are controlled by the control signal CTRa, in some embodiments. For example, the switch SWa may be turned off in response to the control signal CTRa that is activated and turned on in response to the control signal CTRa that is inactivated. Accordingly, in a normal mode, current provided by the current source CSa may flow to the ground node through the switch SWa, and the voltage of the first node N1a, e.g., the ramp voltage $V_{RAMP}$, may approximately be the same as ground potential. The current provided by current source CSa may be supplied to the capacitor Ca such that the capacitor Ca is charged, and accordingly, the ramp voltage $V_{RAMP}$ may gradually increase from the ground potential. In a test mode, the slope of the ramp voltage $V_{RAMP}$ may depend on the current provided by the current source CSa and the capacitance of the capacitor Ca.

Referring to FIG. 4B, the ramp generator 13b may include a current source CSb, a switch SWb, and a capacitor Cb. The current source CSb and the capacitor Cb may be connected in parallel between a first node N1b and a ground node. The current source CSb may drain constant current from the first node N1b to the ground node. The switch SWb may selectively apply the positive supply voltage $V_{DD}$ to the first node N1b according to a control signal CTRb. For example, the switch SWb may be turned off in response to the control signal CTRb that is activated and turned on in response to the control signal CTRb that is inactivated. Accordingly, in the normal mode, the current source CSb may drain current from the positive supply voltage $V_{DD}$, and the voltage of the first node N1b, e.g., the ramp voltage $V_{RAMP}$, may be approximately the same as the positive supply voltage $V_{DD}$. The current source CSb may drain current from the capacitor Cb. When the capacitor Cb is discharged, the ramp voltage $V_{RAMP}$ may gradually decrease from the positive supply voltage $V_{DD}$. In the test mode, the slope of the ramp voltage $V_{RAMP}$ may depend on the current drained by the current source CSb and the capacitance of the capacitor Cb. Hereinafter, it is assumed that, like the ramp generator 13a of FIG. 4A, a ramp generator generates the ramp voltage $V_{RAMP}$ that gradually increases. However, embodiments are not limited thereto, and example embodiments may also be similarly applied to the ramp voltage $V_{RAMP}$ that gradually decreases.

The ramp generator 13c of FIG. 4C may include a current source CSc, a switch SWc, and a resistor Rc. The current source CSc may provide constant current from the positive supply voltage $V_{DD}$ to a first node N1c or a second node N2c. In some embodiments, the ramp generator 13c may include a transistor, which is controlled by a control signal CTRc, and the transistor may be closed or opened by the control signal CTRc. The switch SWc may be coupled to the resistor Rc through the first node N1c according to the control signal CTRc or directly connected to the ground (e.g., a ground node) through the first node N1c. For example, the switch SWc may be connected to the resistor Rc in response to the control signal CTRc that is activated and directly connected to the ground in response to the control signal CTRc that is inactivated. The control signal CTRc that is activated and the control signal CTRc that is inactivated may be respectively connected to elements opposite to each other.

The ramp generator 13c may include a plurality of current sources CSc and a plurality of switches SWc. In an example embodiment, when the switches SWc are sequentially activated, the current sources CSc may be connected to the resistor Rc, and the ramp generator 13c may generate the ramp voltage $V_{RAMP}$ that gradually increases. In an example embodiment, when the switches SWc are sequentially inactivated, the current sources CSc may be connected to the ground node (e.g., the ground), and the ramp generator 13c may generate the ramp voltage $V_{RAMP}$ that gradually decreases. For example, in the case where the ramp generator 13c includes N current sources CSc and N switches SWc, the ramp generator 13c may output the ramp voltage $V_{RAMP}$ of 0 volts (V) when the N switches SWc are all connected to the second node N2c, the ramp generator 13c may output the ramp voltage $V_{RAMP}$ at a first level when one switch SWc is connected to the first node N1c and (N−1) switches SWc are connected to the second node N2c, and the ramp generator 13c may output the ramp voltage $V_{RAMP}$ at an N-th level (upward ramping) when the N switches SWc are all connected to the first node N1c. Through the reverse order of switch connection, the ramp voltage $V_{RAMP}$ having downward ramping may be generated.

Figure 5:
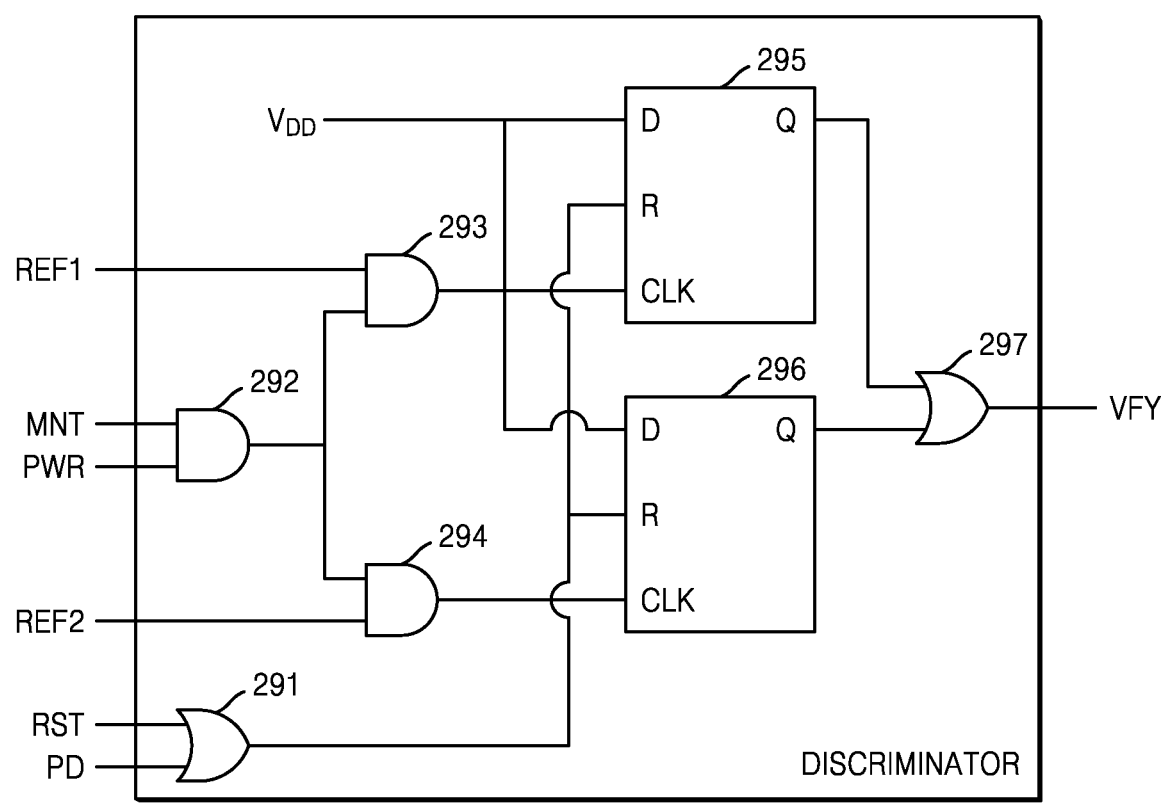
FIG. 5 is a circuit diagram of a discriminator according to an example embodiment.

FIG. 5 is a circuit diagram of the discriminator 290 according to an example embodiment. The discriminator 290 of FIG. 5 is an example of implementing the discriminator 290 in FIG. 3 with digital logic, and for convenience of explanation, redundant descriptions thereof are omitted unless different from those given above.

The discriminator 290 may be implemented by a combination of at least one of, for example, a logic gate, a flip-flop, and/or a logic gate and flip-flops. For example, the discriminator 290 may include a combination of a first gate 291, a second gate 292, a third gate 293, a fourth gate 294, a first flip-flop 295, a second flip-flop 296, and a fifth gate 297. For example, the first gate 291 and the fifth gate 297 may be OR gates, the second through fourth gates 292, 293, and 294 may be AND gates, and the first and second flip-flops 295 and 296 may be D flip-flops. However, example embodiments are not limited thereto. For convenience of description, it is assumed below that the discriminator 290 is implemented by the logic gates and flip-flops described above.

The reset signal RST and a power-down signal PD may be input to input terminals of the first gate 291. The power-down signal PD is a power supply signal for performing a desired function of an electronic system (e.g., the electronic device 10) including the discriminator 290. When the ramp signal RMP sequentially includes a ramping period or a reset ramping period and a signal ramping period, the power signal PWR supplies power to each functional unit such that a particular function is provided during the ramping period. Differently from the power signal PWR supplying power during a single ramping period, the power-down signal PD supplies power to an electronic system or each functional unit during the operation of the electronic system to provide the desired function of the electronic system. A logical operation result of the first gate 291 may be provided to the first flip-flop 295 and the second flip-flop 296.

The monitoring signal MNT and the power signal PWR may be respectively input to input terminals of the second gate 292. The monitoring signal MNT may enable a result of the determination of the discriminator 290 to be output. A logical operation result of the second gate 292 may be provided in common to the third and fourth gates 293 and 294.

A first reference value REF1 and the logical operation result of the second gate 292 may be respectively input to input terminals of the third gate 293. For example, the first reference value REF1 may correspond to the first reference voltage $V_{REF1}$ in FIG. 3. Similarly, a second reference value REF2 and the logical operation result of the second gate 292 may be respectively input to input terminals of the fourth gate 294. For example, the second reference value REF2 may correspond to the second reference voltage $V_{REF2}$ in FIG. 3. A logical operation result of the third gate 293 may be provided to the first flip-flop 295, and a logical operation result of the fourth gate 294 may be provided to the second flip-flop 296.

Each of the first flip-flop 295 and the second flip-flop 296 may be implemented by a D flip-flop, which is a delay-type flip-flop, and thus include an input terminal D, a reset terminal R, a clock terminal CLK, and an output terminal Q.

Referring to FIG. 5, a supply voltage $V_{DD}$ may be provided to the input terminal D of the first flip-flop 295, the logical operation result of the first gate 291 may be provided to the reset terminal R of the first flip-flop 295, the logical operation result of the third gate 293 may be provided to the clock terminal CLK of the first flip-flop 295, and a logical operation result of the first flip-flop 295 may be output from the output terminal Q thereof. Similarly, the supply voltage $V_{DD}$ may be provided to the input terminal D of the second flip-flop 296, the logical operation result of the first gate 291 may be provided to the reset terminal R of the second flip-flop 296, the logical operation result of the fourth gate 294 may be provided to the clock terminal CLK of the second flip-flop 296, and a logical operation result of the second flip-flop 296 may be output from the output terminal Q thereof.

The logical operation result of the first flip-flop 295 and the logical operation result of the second flip-flop 296 may be respectively input to input terminals of the fifth gate 297. The fifth gate 297 may output the verify signal VFY as a logical operation result.

Figure 6:
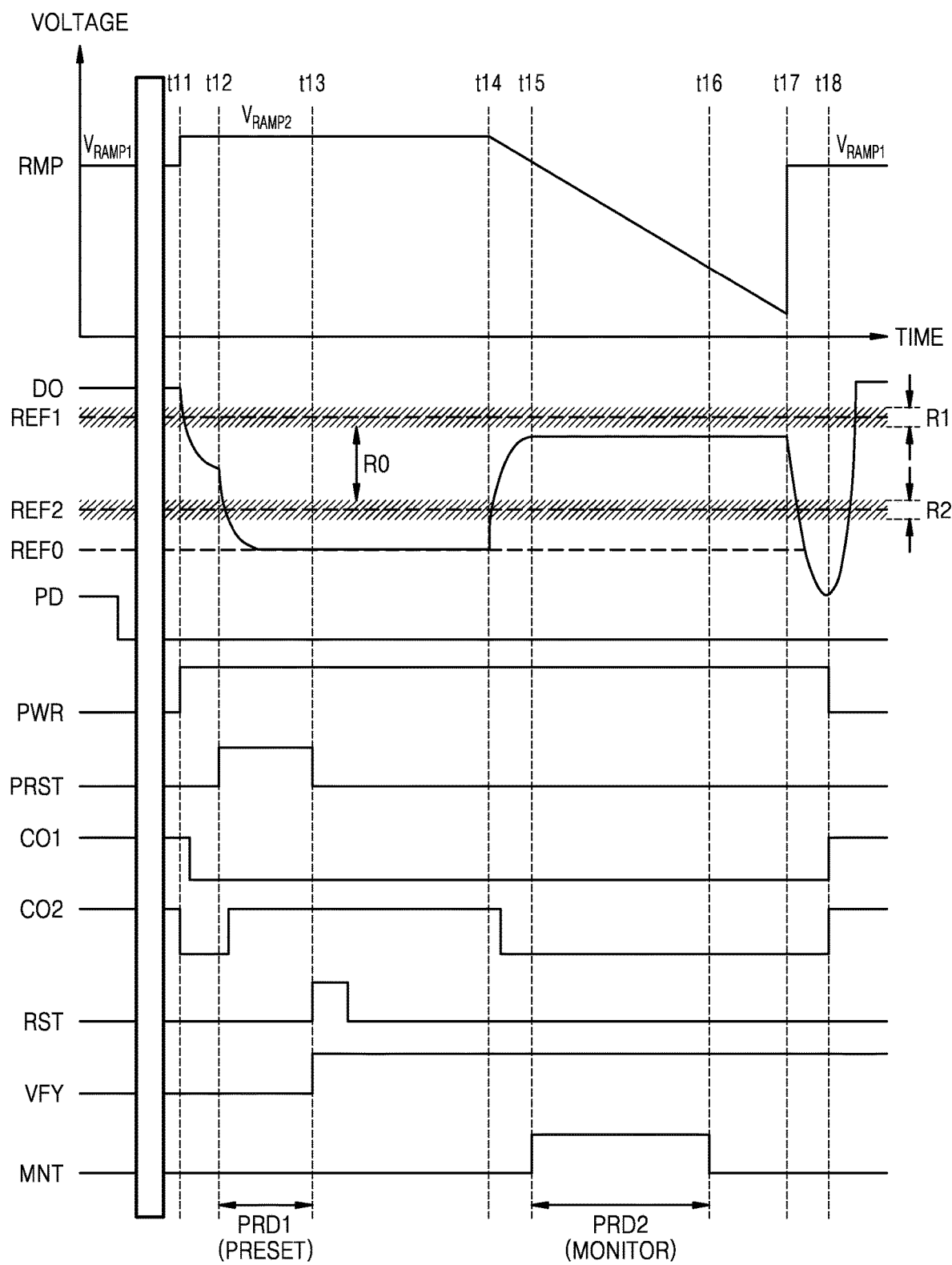
FIG. 6 is a timing diagram illustrating operations of an electronic device, according to an example embodiment.

FIG. 6 is a timing diagram illustrating operations of the electronic device 10, according to an example embodiment. In detail, the timing diagram of FIG. 6 illustrates the operations of the monitoring circuit 200 of FIG. 3, which monitors the ramp signal RMP. Hereinafter, FIG. 6 will be described with reference to FIGS. 1 and 3.

The monitoring circuit 200 may detect a slope of the ramp signal RMP provided from the ramp generator 13 in FIG. 1. The monitoring circuit 200 may discriminate whether the ramp signal RMP is normal or faulty based on internally generated reference values (e.g., the differential reference value REF_D, the upper reference value REF_U, and the lower reference value REF_L), generate the differential output DO and the first and second comparison outputs CO1 and CO2 as internal signals, and generate and output the verify signal VFY as a determination result. For example, the verify signal VFY may be provided to the controller 11 of the electronic device 10 and stop the operation mode of the electronic device 10, which is based on the ramp signal RMP. The monitoring circuit 200 may perform a differential operation on the ramp signal RMP, start a comparison operation, and/or output a comparison result, based on the power-down signal PD, the power signal PWR, the preset signal PRST, the reset signal RST, and/or the monitoring signal MNT, which are provided from the outside of the monitoring circuit 200.

The ramp signal RMP may be implemented as a voltage (or current) signal. The ramp signal RMP may be maintained at a certain voltage level (e.g., a second ramp voltage $V_{RAMP2}$) and may gradually decrease or increase from a certain time point and, when reaching a target level, return to the certain voltage level (e.g., the second ramp voltage $V_{RAMP2}$) or transition to another predetermined level (e.g., a first ramp voltage $V_{RAMP1}$). According to an example embodiment, the ramp signal RMP may be used for CDS. At this time, the ramp signal RMP may include a reset ramping period, in which sensing information is initialized, and a signal ramping period, in which sensing information is generated by performing sampling. For example, the ramp signal RMP used for CDS may include two ramping periods per one process cycle. Although it is illustrated in FIG. 6 that the ramp signal RMP includes one ramping period, it may be construed that one of the reset ramping period and the signal ramping period of the ramp signal RMP used for CDS is illustrated.

The power-down signal PD may provide power to each functional unit of the monitoring circuit 200. When the power-down signal PD is turned off, the electronic device 10 (of FIG. 1) including the monitoring circuit 200 may start to operate. When the power-down signal PD is turned on, the electronic device 10 (of FIG. 1) including the monitoring circuit 200 may stop operating. In an example embodiment, it is assumed that the power-down signal PD is turned off for supply of the ramp signal RMP and monitoring of the ramp signal RMP by the monitoring circuit 200.

The power signal PWR may be turned on during one ramping period of the ramp signal RMP and used as a power supply signal or an operating signal, which operates each element of the monitoring circuit 200 to monitor whether the ramp signal RMP is faulty. For example, the power signal PWR may be turned off at a time point t18, and a monitoring operation during one ramping period of the ramp signal RMP may be terminated. The power signal PWR may be requested to be turned on for ramping period monitoring of a subsequent ramp signal.

As the power signal PWR is turned on at a time point t11, the ramp signal RMP may transition from the first ramp voltage $V_{RAMP1}$ to the second ramp voltage $V_{RAMP2}$. However, this is just an example embodiment, and the voltage level of the ramp signal RMP may be the same before and after the power signal PWR is turned on.

As the power signal PWR is turned on at the time point t11, power may be supplied to the differentiator 210, the upper limit comparator 250, and the lower limit comparator 270, and the differential output DO, the first comparison output CO1, and the second comparison output CO2 may be sequentially generated. For example, as the ramp signal RMP is maintained at the second ramp voltage $V_{RAMP2}$, a voltage variance of the ramp signal RMP with respect to time may gradually decrease.

In some situations, the differential output DO may be required to be in a normal range R0 defined by the first and second reference values REF1 and REF2. To monitor the voltage level of the differential output DO with such a requirement, the monitoring circuit 200 may be designed to use the first reference voltage $V_{REF1}$ included in a first range R1 as an upper limit and the second reference voltage $V_{REF2}$ included in a second range R2 as a lower limit. Accordingly, the discriminator 290 may discriminate whether the ramp signal RMP is faulty by identifying whether the first reference voltage $V_{REF1}$ of the monitoring circuit 200 is in the first range R1 and whether the second reference voltage $V_{REF2}$ of the monitoring circuit 200 is in the second range R2.

The differential output DO may be decreased from a value exceeding the first reference value REF1 to a value less than the first reference value REF1. At a time point where the differential output DO crosses the first reference value REF1 to be less than the first reference value REF1, the voltage level of the first comparison output CO1 may transition from logic high to logic low. As the differential output DO exceeds the second reference value REF2, the second comparison output CO2 may be maintained at a logic low level since the application of the power signal PWR. In an example embodiment, each of the first reference value REF1 and the second reference value REF2 is described as a particular voltage level, but the first reference value REF1 and/or the second reference value REF2 may include a certain range of voltage levels. The first reference value REF1 may refer to the first range R1, and the second reference value REF2 may refer to the second range R2. Each of the first reference value REF1 and the second reference value REF2 may have a predetermined error tolerance limit (e.g., about 5%). For example, when the differential output DO passes a voltage level that is about 1.05 times the first reference value REF1, the upper limit comparator 250 may turn on the first comparison output CO1.

At a time point t12, the preset signal PRST may be turned on. The preset signal PRST may control a switch (e.g., the transistor TR) to be on and off between the positive and negative input terminals of the differentiator 210. When the preset signal PRST turns on the switch and the positive and negative input terminals of the differentiator 210 are short-circuited, the transconductance of the differentiator 210 may be relatively very high, and accordingly, the transient state of the differential output DO, which results from application of the ramp voltage $V_{RAMP}$, may be relatively quickly stabilized. In FIG. 6, an operation, in which the differentiator 210 is quickly stabilized by turning on the preset signal PRST, may be referred to as a preset operation, and a first period PRD1 (from the time point t12 to a time point t13), during which the preset signal PRST is in an on-state, may be referred to as a preset period. At the time point t13, the preset signal PRST transitions to logic low (e.g., a turn-off state).

As the ramp signal RMP is maintained at the second ramp voltage $V_{RAMP2}$ during the first period PRD1 between the time point t12 and the time point t13, the voltage variance of the ramp signal RMP with respect to time may gradually decrease, and the differential output DO may decrease from a value exceeding the second reference value REF2 to a value less than the second reference value REF2. At a time point where the differential output DO crosses the second reference value REF2 to be less than the second reference value REF2, the voltage level of the second comparison output CO2 may transition from logic low to logic high.

As the ramp signal RMP is maintained constant during the first period PRD1 between the time point t12 and the time point t13, the transient state of the differential output DO may be quickly stabilized and reach the zeroth reference value REF0 as a steady state. The zeroth reference value REF0 may correspond to a value of the differential output DO when the voltage variance of the ramp signal RMP with respect to time is substantially close to 0. At the time point t13, the reset signal RST may be turned on. As the reset signal RST is turned on, the discriminator 290 may start to generate the verify signal VFY. The verify signal VFY may be turned on in response to the transition of the reset signal RST.

In an example embodiment, it is assumed that the logic high of the verify signal VFY indicates that the ramp signal RMP is "normal" and the logic low of the verify signal VFY indicates that the ramp signal RMP is faulty, but whether the ramp signal RMP is normal may be discriminated using opposite logic levels. In a period between the time point t13 and a time point t14, the reset signal RST may be turned off.

At the time point t14, the ramp signal RMP may start to ramp. According to an example embodiment, the ramp signal RMP may gradually decrease from the time point t14 to a time point t17, but this is just an example. Embodiments do not exclude a case where the ramp signal RMP gradually increases. According to an example embodiment, the ramping period of the ramp signal RMP in FIG. 6 may correspond to a reset ramping period or a signal ramping period.

As the ramp signal RMP has a certain slope between the time point t14 and a time point t15, the differential output DO may gradually increase (in the transient state). According to an example embodiment, at a time point where the differential output DO passes the second reference value REF2 to be greater than the second reference value REF2, the voltage level of the second comparison output CO2 may transition from logic high to logic low. After the transition of the second comparison output CO2, the differential output DO may reach a certain level, which corresponds to the slope of the ramp signal RMP during the ramping period (in the steady state).

At the time point t15, the monitoring signal MNT may be turned on. As the monitoring signal MNT is turned on a certain time after the ramp signal RMP starts to ramp, the differential output DO may be not in the transient state but in the steady state.

According to an example embodiment, the discriminator 290 may output the verify signal VFY as the monitoring signal MNT is turned on. The discriminator 290 may discriminate whether the slope of the ramp signal RMP is in the normal range R0 based on the first comparison output CO1 and the second comparison output CO2, and output the verify signal VFY, which is a discrimination result (also referred to as a determination result), at the time when the monitoring signal MNT is turned on. A period between the time point t15 and a time point t16, during which the monitoring signal MNT is in a turn-on state, is referred to as a second period (or a monitoring period) PRD2. Because the ramp signal RMP is in the normal range R0 in FIG. 6, the verify signal VFY may remain logic high even in the monitoring period. For example, the verify signal VFY that is logic high may indicate that the ramp signal RMP is normal.

In an example embodiment, the logic level of the verify signal VFY indicates whether the ramp signal RMP is normal, but embodiments are not limited thereto. Indication of whether the ramp signal RMP is normal or faulty may be variously embodied. For example, a normal flag or a fault flag may be generated and attached to an output signal.

At the time point t17, the ramping of the ramp signal RMP ends, and the ramp signal RMP may return to the original voltage level (e.g., the first ramp voltage $V_{RAMP1}$) or transition to a certain level (e.g., the second ramp voltage $V_{RAMP2}$).

At the time point t18, the power signal PWR may transition to logic low. As the power signal PWR is turned off, power supplied to each functional unit of the monitoring circuit 200 may be interrupted, and the operations of the differentiator 210, the upper limit comparator 250, the lower limit comparator 270, and the discriminator 290 may be stopped. As the operations of the upper limit comparator 250 and the lower limit comparator 270 are stopped, the first comparison output CO1 and the second comparison output CO2 may transition to logic high that is preset as an initial state.

Figure 7:
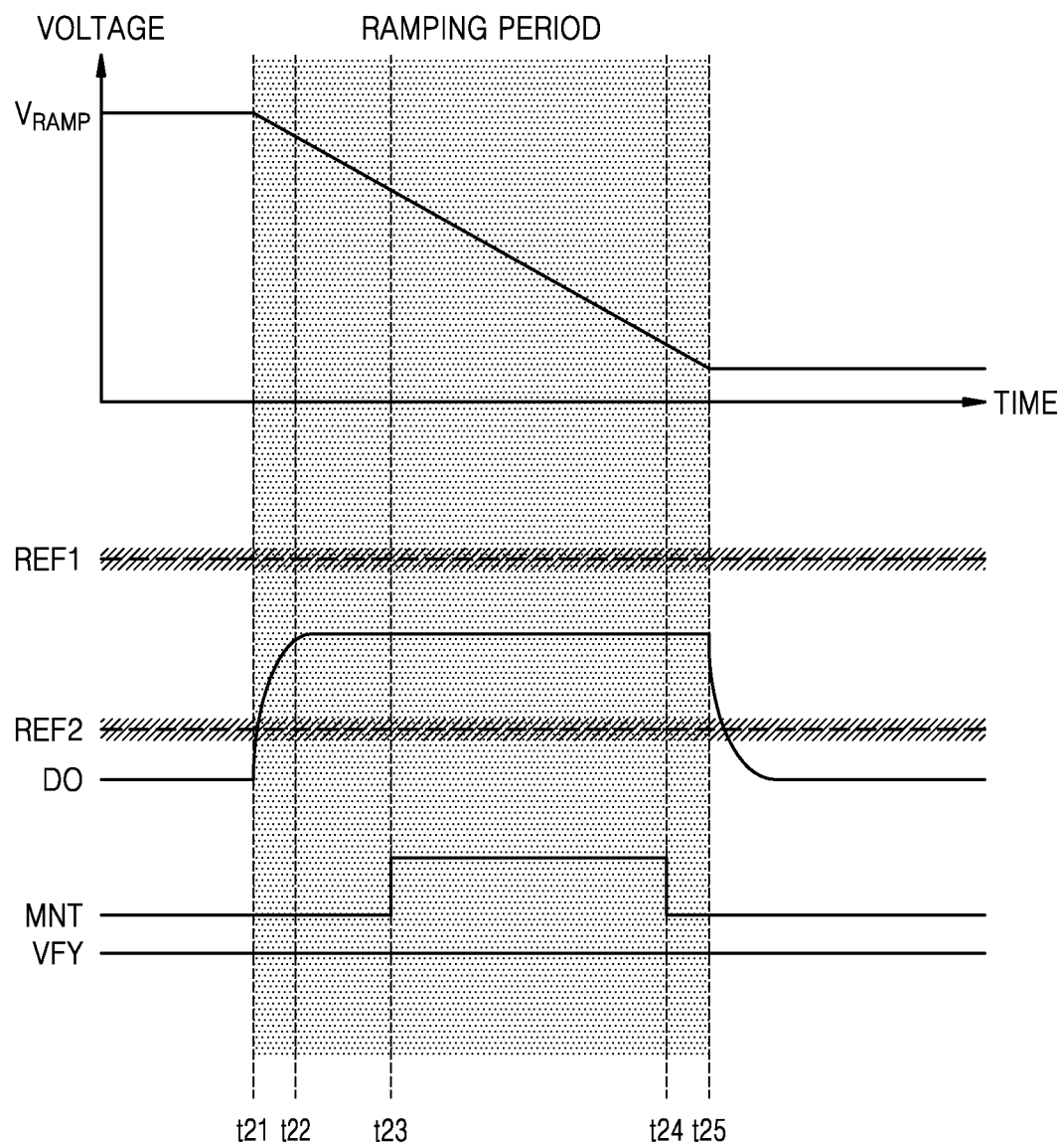
FIG. 7 is a timing diagram illustrating operations of an electronic device, according to an example embodiment.

FIG. 7 is a timing diagram illustrating operations of the electronic device 10, according to an example embodiment. FIG. 7 shows reconfiguration of the timing diagram of FIG. 6, and thus, redundant descriptions given with reference to FIG. 6 are omitted. FIGS. 1 and 3 will be referred to together.

At a time point t21, the ramp signal RMP maintained at a ramp voltage $V_{RAMP}$ may start to ramp. As the ramp signal RMP starts downward ramping, the differential output DO may increase. In a period between the time point t21 and a time point t22, the differential output DO may cross the second reference value REF2 and may be in the transient state. The monitoring signal MNT may have a logic low state as an initial value, and the verify signal VFY may have a logic high state as an initial value.

At the time point t22, the differential output DO may reach the steady state. In an example embodiment, the differential output DO may reach a voltage level, which corresponds to the slope of the ramp signal RMP in the ramping period between the time point t21 to a time point t25. The value of the differential output DO in the steady state may be less than the first reference value REF1 and greater than the second reference value REF2.

At a time point t23, the monitoring signal MNT may be turned on. As the monitoring signal MNT is turned on, the verify signal VFY may be generated and output. To calculate the slope of the ramp signal RMP while the slope of the ramp signal RMP is maintained constant, the monitoring signal MNT may be turned on a certain time after the ramp signal RMP starts to ramp. As the differential output DO is less than the first reference value REF1 and greater than the second reference value REF2, the verify signal VFY may remain logic high. According to an example embodiment, the monitoring circuit 15 in FIG. 1 may provide information indicating that the ramp signal RMP is normal to the controller 11 in FIG. 1.

At a time point t25, the monitoring signal MNT may be turned off. When the monitoring signal MNT is turned off, output of the verify signal VFY may be stopped. To calculate the slope of the ramp signal RMP while the slope of the ramp signal RMP is maintained constant, the monitoring signal MNT may be turned off before the ramping of the ramp signal RMP ends.

At the time point t25, the downward ramping of the ramp signal RMP may be terminated. After the time point t25, the ramp signal RMP may be maintained at a certain level, and the differential output DO may decrease to a voltage level, which corresponds to a state in which voltage variance of the ramp signal RMP with respect to time is nearly zero.

Figure 8A:
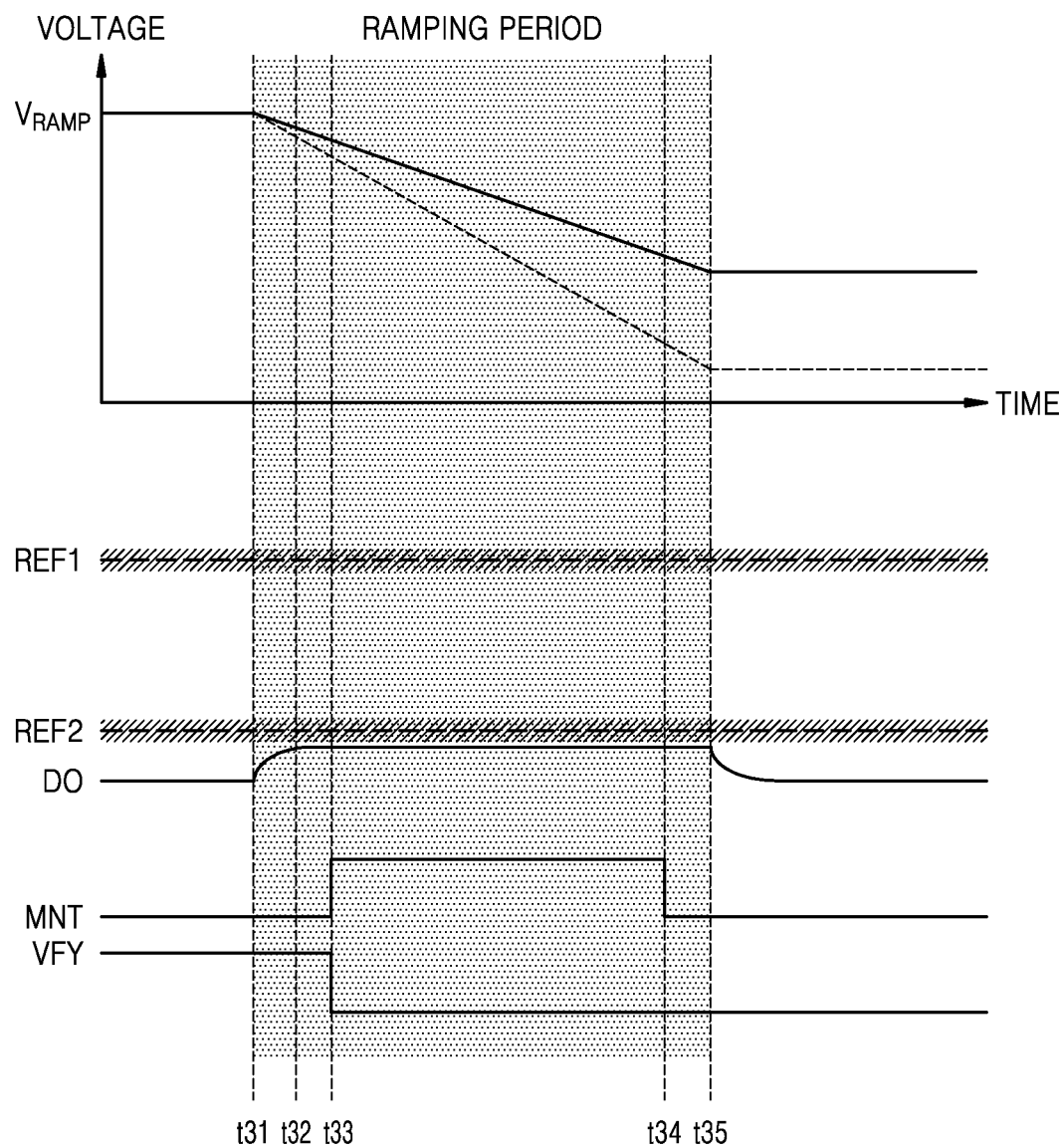
FIGS. 8A through 8C are timing diagrams illustrating operations of an electronic device, according to example embodiments.
Figure 8B:
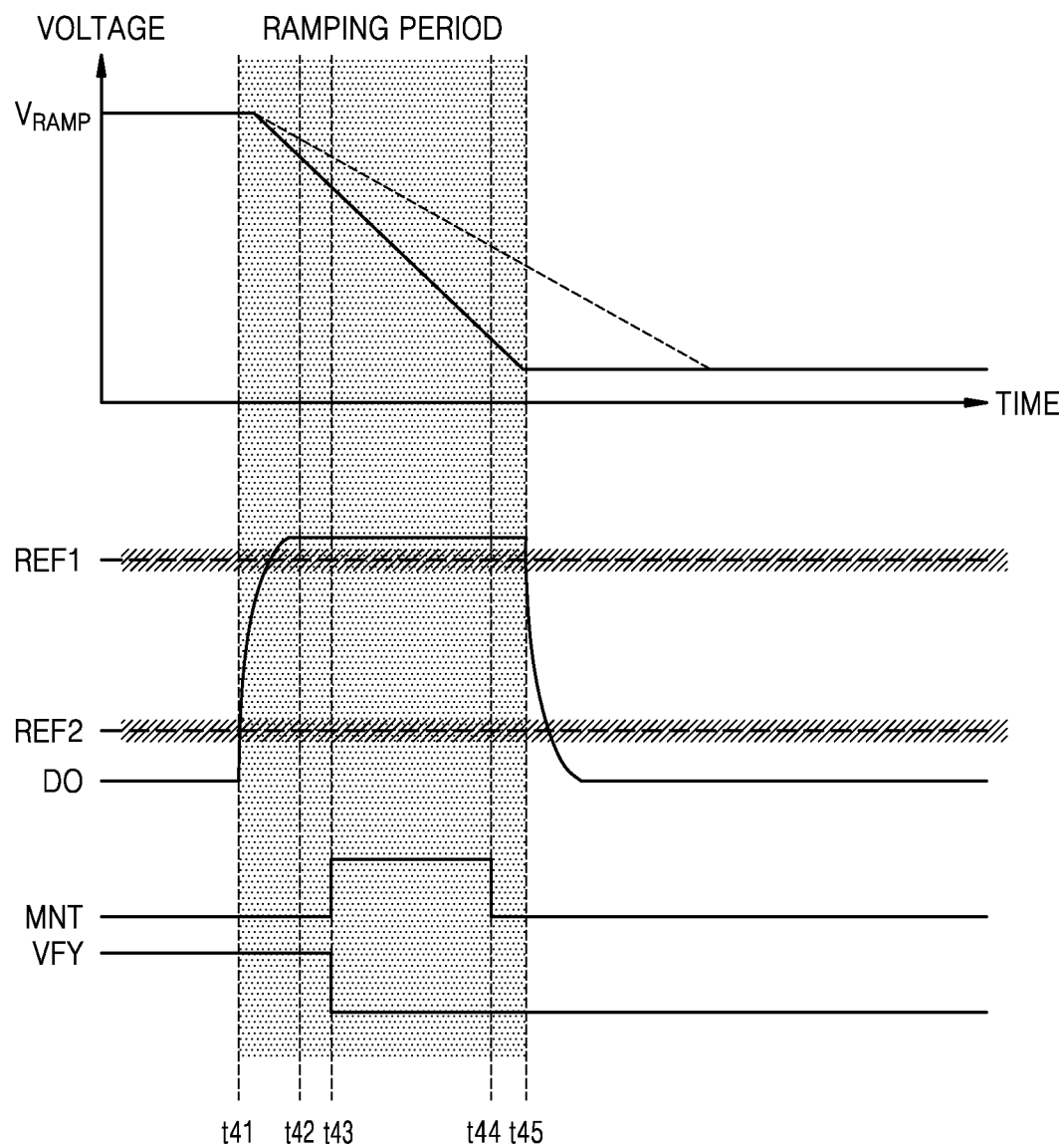
Figure 8C:
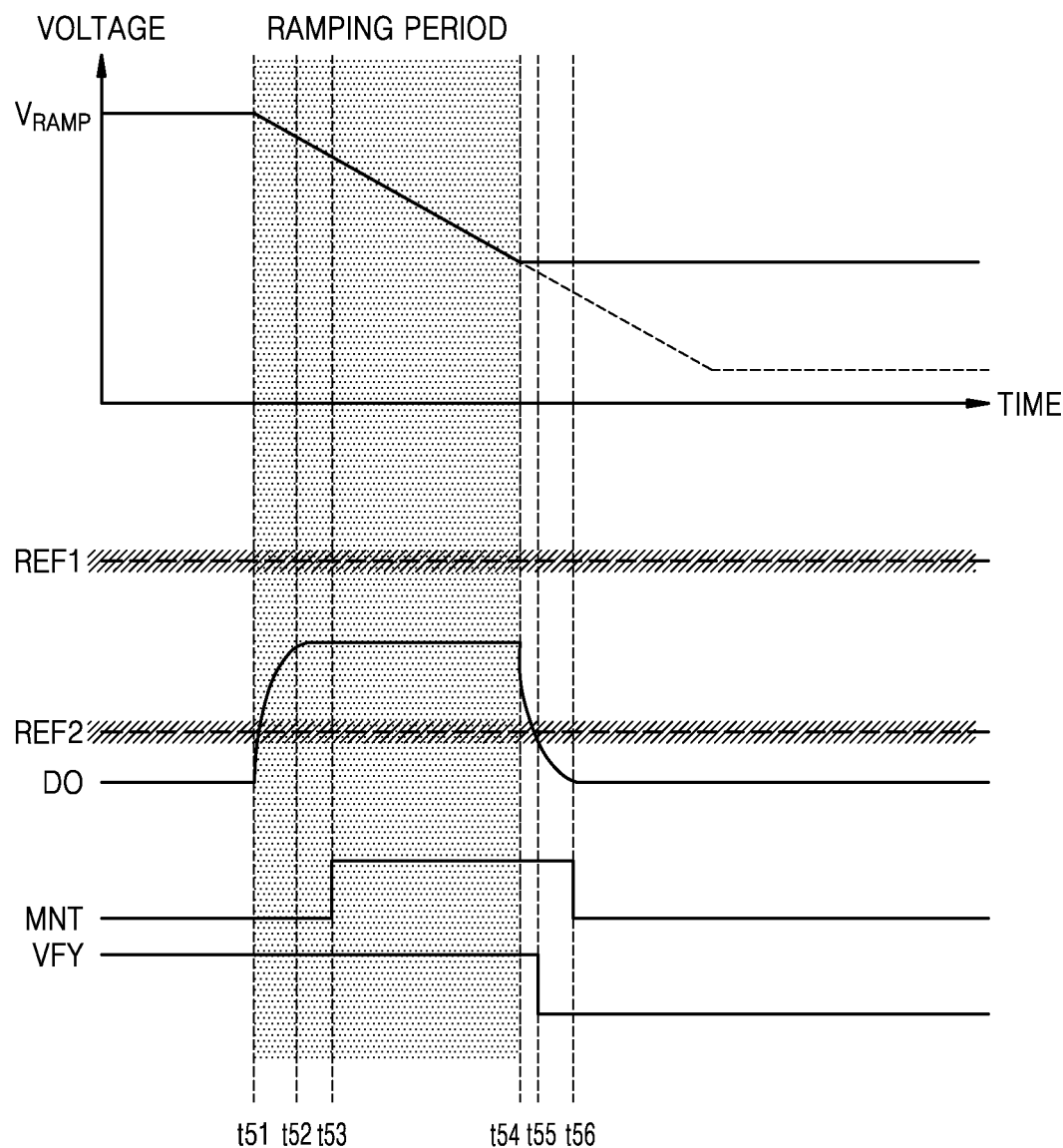

FIGS. 8A through 8C are timing diagrams illustrating operations of the electronic device 10, according to example embodiments. FIGS. 8A through 8C show reconfigurations of the timing diagram of FIG. 6.

In an example embodiment, the ramp signal RMP may not be normally generated because, for example, a fault occurs during the manufacture of the ramp generator 13 in FIG. 1, a fault occurs in an electrical element mounted on the ramp generator 13, the electrical element is deteriorated due to ageing, or an external impact is applied to the electronic device 10 of FIG. 1. FIGS. 8A through 8C illustrate embodiments in the case where a fault occurs in the ramp signal RMP due to any of the issues described above. Redundant descriptions given with reference to FIGS. 6 and 7 are omitted.

Referring to FIGS. 1 and 8A, the ramp signal RMP maintained at the ramp voltage $V_{RAMP}$ may start to ramp at a time point t31. However, the slope of the ramp signal RMP (solid line) may be less than the slope of the ramp signal RMP (dashed line) in FIG. 7. In other words, the ramping of the ramp signal RMP may be abnormally slow. As the ramp signal RMP starts downward ramping in a period between the time point t31 and a time point t32, the differential output DO may increase (in the transient state).

At the time point t32, the differential output DO may reach the steady state. In an example embodiment, the differential output DO may reach a voltage level, which corresponds to the slope of the ramp signal RMP in the ramping period between the time point t31 and a time point t35. The value of the differential output DO in the steady state may be less than both the first reference value REF1 and the second reference value REF2.

At a time point t33, the monitoring signal MNT may be turned on. When the monitoring signal MNT is turned on, the verify signal VFY may start to change and may be output. The discriminator 290 in FIG. 3 may not start a discrimination operation when the monitoring signal MNT is logic low and may start to generate the verify signal VFY when the monitoring signal MNT is logic high.

At the time that substantially coincides with the time when the monitoring signal MNT transitions to logic high, the verify signal VFY may transition to logic low. The discriminator 290 may determine that the ramp signal RMP is abnormal (e.g., faulty) after identifying that the differential output DO is less than the second reference value REF2 and change the voltage level of the verify signal VFY from logic high to logic low.

The verify signal VFY may be output to the outside of the monitoring circuit 15 in FIG. 1. According to an example embodiment, the monitoring circuit 15 may provide the controller 11 in FIG. 1 with information indicating that the ramp signal RMP is faulty. According to an example embodiment, as the verify signal VFY is logic low, the controller 11 may stop the operation of the main circuit 17 (in FIG. 1), which is based on the ramp signal RMP, or inform a user of the electronic device 10 that an operation based on the ramp signal RMP is abnormal.

At a time point t34, the monitoring signal MNT may be turned off. According to an example embodiment, even when the monitoring signal MNT is turned off, the output of the verify signal VFY may be maintained until the reset signal RST is turned on. Because the verify signal VFY is continuously output even after the monitoring signal MNT is turned off, information about whether the ramp signal RMP is faulty may be provided any time.

At the time point t35, the downward ramping of the ramp signal RMP may stop. After the time point t35, the ramp signal RMP may be maintained at a certain level, and the differential output DO may decrease to a voltage level, which corresponds to a state in which voltage variance of the ramp signal RMP with respect to time is nearly zero.

Referring to FIGS. 1 and 8B, the ramp signal RMP maintained at the ramp voltage $V_{RAMP}$ may start to ramp at a time point t41. However, the slope of the ramp signal RMP (solid line) may be greater than the slope of the ramp signal RMP (dashed line) in FIG. 7. In other words, the ramping of the ramp signal RMP may be abnormally fast. As the ramp signal RMP starts downward ramping in a period between the time point t41 and a time point t42, the differential output DO may increase (in the transient state).

At the time point t42, the differential output DO may reach the steady state. In an example embodiment, the differential output DO may reach a voltage level, which corresponds to the slope of the ramp signal RMP in the ramping period between the time point t41 and a time point t45. The value of the differential output DO in the steady state may be greater than both the first reference value REF1 and the second reference value REF2.

At a time point t43, the monitoring signal MNT may be turned on. When the monitoring signal MNT is turned on, the verify signal VFY may start to change and may be output. The discriminator 290 may not start a discrimination operation when the monitoring signal MNT is logic low and may start to generate the verify signal VFY when the monitoring signal MNT is logic high. At the time that substantially coincides with the time when the monitoring signal MNT transitions to logic high, the discriminator 290 may identify that the differential output DO is greater than the first reference value REF1 and determine that the ramp signal RMP is abnormal (e.g., faulty). In an example embodiment, the discriminator 290 may change the voltage level of the verify signal VFY from logic high to logic low.

The verify signal VFY may be output to the outside of the monitoring circuit 15. According to an example embodiment, the monitoring circuit 15 may provide the controller 11 with information indicating that the ramp signal RMP is faulty. According to an example embodiment, as the verify signal VFY is logic low, the controller 11 may stop the operation of the main circuit 17, which is based on the ramp signal RMP, or inform a user of the electronic device 10 that an operation based on the ramp signal RMP is abnormal.

At a time point t44, the monitoring signal MNT may be turned off. According to an example embodiment, even when the monitoring signal MNT is turned off, the output of the verify signal VFY may be maintained until the reset signal RST is turned on. Because the verify signal VFY is continuously output even after the monitoring signal MNT is turned off, information about whether the ramp signal RMP is faulty may be provided any time.

At the time point t45, the downward ramping of the ramp signal RMP may stop. After the time point t45, the ramp signal RMP may be maintained at a certain level, and the differential output DO may decrease to a voltage level, which corresponds to a state in which voltage variance of the ramp signal RMP with respect to time is nearly zero.

Referring to FIGS. 1 and 8C, the ramp signal RMP maintained at the ramp voltage $V_{RAMP}$ may start to ramp at a time point t51. The slope of the ramp signal RMP (solid line) may be substantially the same as the slope of the ramp signal RMP (dashed line) in FIG. 7. However, the ramp signal RMP may not decrease to a target level, and the ramping may be abruptly stopped. In other words, the ramping period of the ramp signal RMP may be abnormally short. As the ramp signal RMP starts downward ramping in a period between the time point t51 and a time point t52, the differential output DO may increase (in the transient state).

At the time point t52, the differential output DO may reach the steady state. In an example embodiment, the differential output DO may reach a voltage level, which corresponds to the slope of the ramp signal RMP in the ramping period between the time point t51 and a time point t54. The value of the differential output DO in the steady state may be less than the first reference value REF1 and greater than the second reference value REF2.

At a time point t53, the monitoring signal MNT may be turned on. As the monitoring signal MNT is turned on, the discriminator 290 may start verification and output the verify signal VFY. As the differential output DO is in a normal range, the discriminator 290 may determine that the ramp signal RMP is normal. In an example embodiment, the discriminator 290 may maintain the voltage level of the verify signal VFY logic high. According to an example embodiment, the monitoring circuit 15 may provide the controller 11 with information indicating that the ramp signal RMP is normal.

At the time point t54, the ramping of the ramp signal RMP may be abruptly stopped. For example, when there is an external impact on the ramp generator 13 or a breakdown in an internal circuit or element of the ramp generator 13, the ramp signal RMP may not be normally provided. When the ramping of the ramp signal RMP is stopped, voltage variance of the ramp signal RMP with respect to time may change, and the differential output DO may gradually decrease.

At a time point t55, the differential output DO that is decreasing may cross the second reference value REF2. When the differential output DO is less than the second reference value REF2, the discriminator 290 may change the verify signal VFY to logic low. At the time point t55, the monitoring signal MNT is still in the on-state, and accordingly, the verify signal VFY may be output. According to an example embodiment, a turn-on period between the time points t53 and t56, during which the monitoring signal MNT is in the turn-on state, may be determined according to the design of elements of the ramp generator 13 or set in advance during the manufacture or design of the ramp generator 13 to properly determine a ramping period in which the ramp signal RMP has a certain slope. Accordingly, the monitoring signal MNT may remain turned on during the predetermined turn-on period even though the ramping of the ramp signal RMP is abruptly stopped. According to an example embodiment, in response to logic low of the verify signal VFY, the controller 11 may stop the operation of the main circuit 17, which is based on the ramp signal RMP, or inform a user of the electronic device 10 that an operation based on the ramp signal RMP is abnormal.

At a time point t56, the monitoring signal MNT may be turned off with the lapse of the predetermined turn-on period between the time points t53 and t56. When the monitoring signal MNT is turned off, the output of the verify signal VFY may be stopped.

Figure 9:
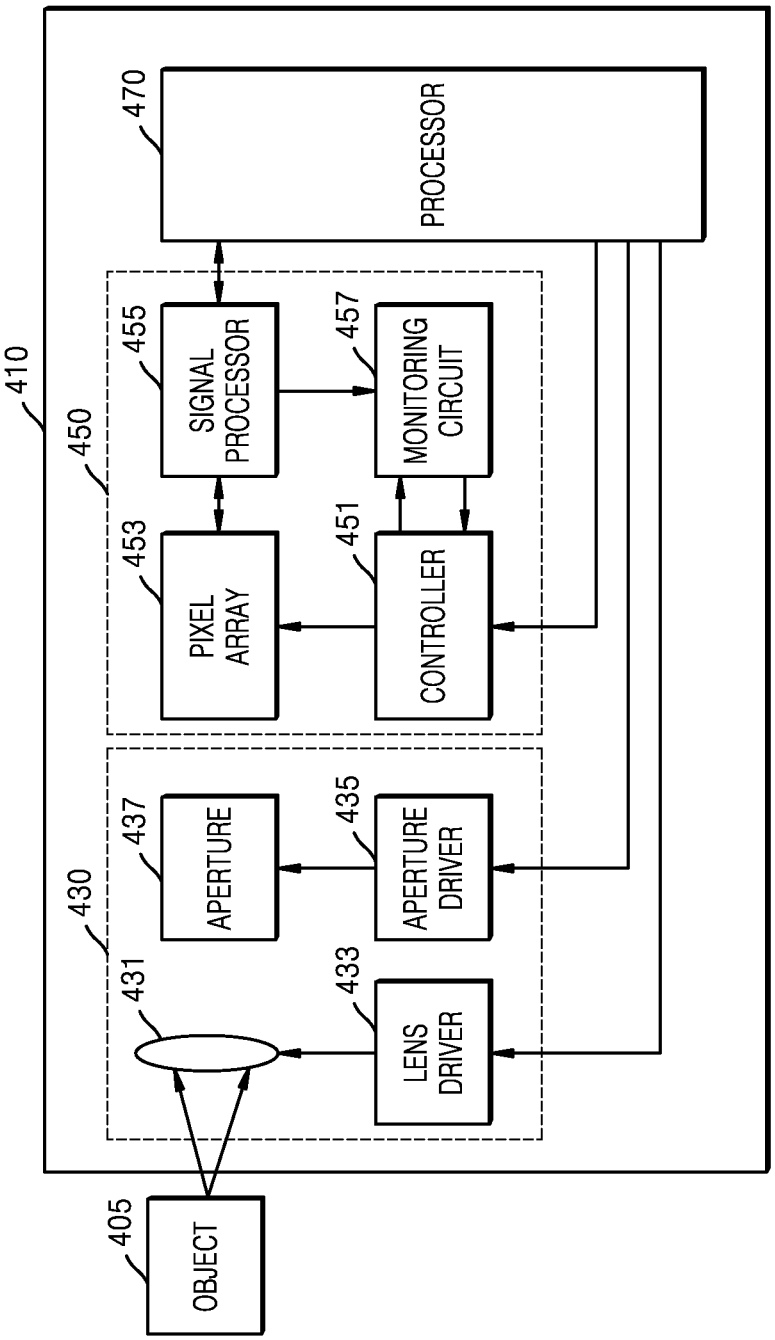
FIG. 9 is a block diagram of an imaging device according to an example embodiment.

FIG. 9 is a block diagram of an imaging device 20 according to an example embodiment. The imaging device 20 may be an example of the electronic device 10 described with reference to FIG. 1.

The imaging device 20 may be mounted on electronic devices having a function of sensing an image or light. For example, the imaging device 20 may be mounted on electronic devices such as a camera, a smartphone, a wearable device, an Internet of Things (IoT) device, a home appliance, a table personal computer (PC), a personal digital assistant (PDA), a portable multimedia player (PMP), a navigation device, a drone, and an advanced drivers assistance system (ADAS). The imaging device 20 may also be mounted on electronic devices that are used as components of, for example, vehicles, furniture, manufacturing facilities, doors, or various kinds of measuring equipment.

The imaging device 20 may include an imaging unit 430, an image sensor 450, and a processor 470. The imaging device 20 may have an autofocus function (hereinafter, referred to as an AF function).

The operations of the imaging device 20 may be controlled by the processor 470. The processor 470 may provide each of a lens driver 433, an aperture driver 435, and a controller 451 with a control signal for an operation of each element.

The imaging unit 430 receives light and may include a lens 431, the lens driver 433, an aperture 437, and the aperture driver 435. The lens 431 may include a plurality of lenses.

The lens driver 433 may exchange information about focus detection with the processor 470 and may control the position of the lens 431 according to a control signal from the processor 470. The lens driver 433 may control the position of the lens 431 by moving the lens 431. For example, the lens driver 433 may move the lens 431 in a direction away from or toward an object 405, thereby controlling the distance between the lens 431 and the object 405. The object 405 may be in focus or out of focus according to the position of the lens 431.

The image sensor 450 may convert incident light into an image signal. The image sensor 450 may include a pixel array 453, the controller 451, a signal processor 455, and a monitoring circuit 457. An optical signal that has passed through the lens 431 and the aperture 437 may form an image of the object 405 when the optical signal reaches a light receiving surface of the pixel array 453. The monitoring circuit 100 of FIG. 2 or the monitoring circuit 200 of FIG. 3 may be used as the monitoring circuit 457 in FIG. 9, and thus, redundant descriptions thereof are omitted.

The pixel array 453 may include a complementary metal-oxide semiconductor (CMOS) image sensor (CIS), which converts an optical signal into an electrical signal. The sensitivity of the pixel array 453 may be controlled by the controller 451. The pixel array 453 may include a plurality of pixels disposed in a matrix formation. Each of the pixels may include a microlens and at least two photoelectric conversion elements arranged in parallel with each other below the microlens. Each of the pixels may include at least one first photoelectric conversion element and at least one second photoelectric conversion element, which are parallel with each other. A pixel may output a first image signal generated by the first photoelectric conversion element or a second image signal generated by the second photoelectric conversion element. The pixel may output a sum image signal generated by the first and second photoelectric conversion elements.

The signal processor 455 may generate a phase detection signal pair, which is used in a phase difference calculation, based on the first image signal and the second image signal, which are output from at least two pixels in different adjacent rows and one column in the pixel array 453. In the case of out-of-focus, the phase of the first image signal may be different from the phase of the second image signal. For example, the intensity of the first image signal may be different from the intensity of the second image signal. In the case of in-focus, the phase of the first image signal may be the same as the phase of the second image signal.

The signal processor 455 may generate a plurality of phase detection signal pairs based on a plurality of first image signals and a plurality of second image signals, which are output from the pixel array 453. The phase detection signal pairs or a first image and a second image, which are generated from the phase detection signal pairs, may be provided to the processor 470 as autofocus data.

The processor 470 may receive image data from the image sensor 450. The image data may include an image and/or autofocus data in units of frames. The processor 470 may perform a phase difference calculation for an AF function using the autofocus data. In an example embodiment, the processor 470 may perform a phase difference calculation based on a plurality of phase detection signal pairs included in the autofocus data. For example, the processor 470 may generate a first image based on a plurality of first phase detection signals among the phase detection signal pairs and a second image based on a plurality of second phase detection signals among the phase detection signal pairs and may calculate a phase difference between the first image and the second image.

Through the phase difference calculation, the processor 470 may obtain a position of a focus, at which the intensities of two phase detection signals included in a phase detection signal pair are identical to each other (e.g., the phase of the first image is the same as the phase of the second image), a direction of the focus, and/or a distance between the object 405 and the image sensor 450.

The processor 470 may generate a control signal for controlling the lens driver 433 to move the lens 431 based on a phase difference calculation result and may output the control signal to the lens driver 433.

Figure 10:
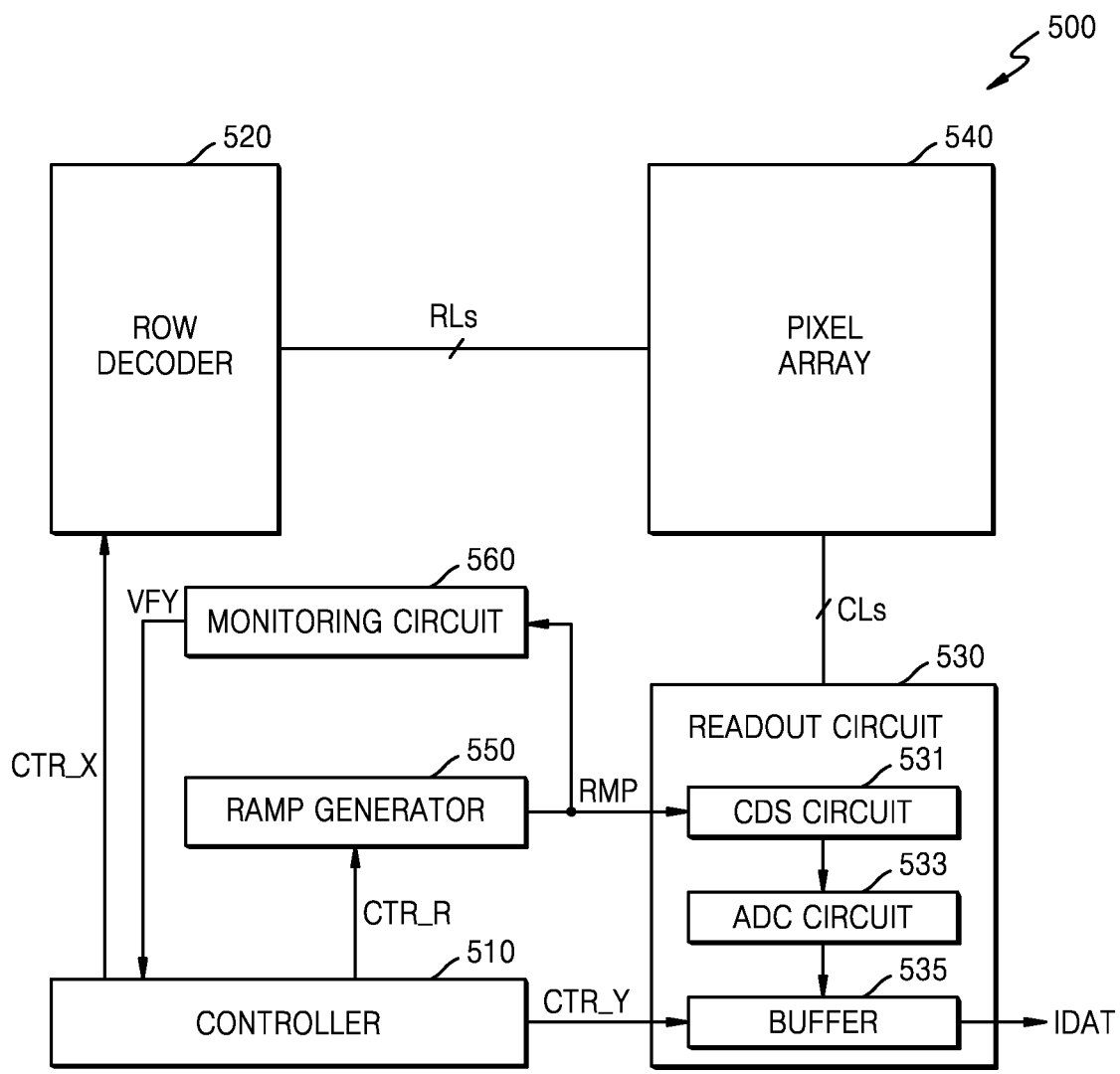
FIG. 10 is a block diagram of an image sensor according to an example embodiment.

FIG. 10 is a block diagram of an image sensor 500 according to an example embodiment. The image sensor 500 of FIG. 10 may be an example of the image sensor 450 in FIG. 9.

Referring to FIGS. 9 and 10, the image sensor 500 may include a controller 510, a row decoder 520, a readout circuit 530, a pixel array 540, a ramp generator 550, and a monitoring circuit 560. In an example embodiment, the image sensor 500 may further include a clock signal generator, a signal processor, a column decoder, and/or a memory. The monitoring circuit 100 of FIG. 2 or the monitoring circuit 200 of FIG. 3 may be used as the monitoring circuit 560 in FIG. 10, and thus, redundant descriptions thereof are omitted.

The controller 510 may provide control signals for controlling the timings of the row decoder 520, the readout circuit 530, and the ramp generator 550. For example, the controller 510 may provide a row control signal CTR_X to the row decoder 520, and the row decoder 520 may allow sensing to be performed on the pixel array 540 row by row through row lines RLs based on the row control signal CTR_X. For example, the controller 510 may provide a column control signal CTR_Y to the readout circuit 530, and the readout circuit 530 may receive a sensing signal from the pixel array 540 through column lines CLs based on the column control signal CTR_Y. For example, the controller 510 may provide a ramp control signal CTR_R to the ramp generator 550, and the ramp generator 550 may generate the ramp signal RMP for the operation of the readout circuit 530 based on the ramp control signal CTR_R.

According to an example embodiment, the controller 510 may receive the verify signal VFY from the monitoring circuit 560 and sense an abnormal operation of the ramp signal RMP generated by the ramp generator 550. The controller 510 may discriminate an operation beyond the normal range of the ramp signal RMP or a fault of the ramp generator 550 and thus stop the operation of the readout circuit 530, which operates based on the ramp signal RMP. For example, a CDS or counting operation of the readout circuit 530 may be stopped, and accordingly, output of image data IDAT generated by the readout circuit 530 may also be stopped.

The controller 510 may be implemented as a processing circuit, such as a hardware component including a logic circuit, or implemented by a combination of hardware and software, such as a processor executing software performing compression. For example, the controller 510 may include a CPU, an ALU performing arithmetic and logical operations, bit shift, or the like, a DSP, a microprocessor, an ASIC, a control logic, or the like, which is included in the image sensor 500, but is not limited thereto, as described above.

Under the control (e.g., the row control signal CTR_X) of the controller 510, the row decoder 520 may generate control signals for driving the pixel array 540 and drive a plurality of pixels of the pixel array 540 row by row through the row lines RLs. Each of the row lines RLs may extend in a row direction and may be connected to pixels arranged in one row.

In an example embodiment, the row decoder 520 may control a plurality of pixels of the pixel array 540 to sense incident light simultaneously or row by row. The row decoder 520 may control the pixel array 540 such that pixels are selected row by row and a reset voltage and a sensing voltage, which are generated by the selected pixels (e.g., pixels in one row), are output through a plurality of column lines CLs.

The pixel array 540 may include a plurality of pixels in a matrix and the row lines RLs and the column lines CLs, which are connected to the pixels. For example, each of the row lines RLs may transmit control signals from the row decoder 520 to a plurality of transistors included in each pixel, and each of the column lines CLs may transmit pixel signals from pixels of each row of the pixel array 540 to the readout circuit 530. Each of the column lines CLs may extend in a column direction and may connect pixels of one column to the readout circuit 530.

According to an example embodiment, each of the pixels may include at least one photoelectric conversion element (or photosensitive device) and a transistor. The photoelectric conversion element may sense light and convert the light into a photocharge. For example, the photoelectric conversion element may include a photosensitive device, such as an inorganic photodiode, an organic photodiode, a Perovskite photodiode, a photo transistor, a photogate, or a pinned photodiode, which includes an organic or inorganic material.

In an example embodiment, each of the pixels may include a plurality of photoelectric conversion elements. A transistor may transmit charges stored in a photoelectric conversion element, reset the photoelectric conversion element to a supply voltage, or convert the charges into an electrical signal.

A plurality of pixels may include a red pixel, a green pixel, and a blue pixel. The red pixel may generate an image signal (or charges) corresponding to a red color signal in response to wavelengths in the red range of the visible spectrum. The green pixel may generate an image signal (or charges) corresponding to a green color signal in response to wavelengths in the green range of the visible spectrum. The blue pixel may generate an image signal (or charges) corresponding to a blue color signal in response to wavelengths in the blue range of the visible spectrum. However, embodiments are not limited thereto, and the pixels may further include a white pixel. For example, the pixels may include a cyan pixel, a yellow pixel, a magenta pixel, or a white pixel.

A microlens and a color filter may be stacked above each of the pixels. A plurality of color filters of the pixels may form a color filter array. A color filter may pass a certain color of light, e.g., wavelengths in a certain color range, in the light incident through a microlens. A color sensed by a pixel may be determined according to a color filter of the pixel. However, embodiments are not limited thereto. According to an embodiment, light corresponding to wavelengths in a color range may be converted into an electrical signal according to the level of an electrical signal, e.g., a voltage level, applied to a photoelectric conversion element of the pixel, and therefore, a color sensed by the pixel may be determined according to the level of the electrical signal applied to the photoelectric conversion element.

The readout circuit 530 may receive pixel signals from the pixel array 540 through the column lines CLs and output the image data IDAT as a result of processing the pixel signals. The readout circuit 530 may include a CDS circuit 531, an analog-to-digital converter (ADC) circuit 533, and a buffer 535.

The CDS circuit 531 may include a plurality of comparators and compare pixels signals, which are received from the pixel array 540 through the column lines CLs, with the ramp signal RMP received from the ramp generator 550. Each comparator may compare a pixel signal with the ramp signal RMP that has been buffered and output a comparison result as logic low or logic high. In an example embodiment, when the level of the ramp signal RMP is the same as the level of the pixel signal, the comparator may output a comparison signal that transitions from a first level (e.g., logic high) to a second level (e.g., logic low). A level transition time of the comparison signal may be determined according to the level of the pixel signal.

A plurality of pixel signals that are respectively output from a plurality of pixels may have a variation due to intrinsic characteristics (e.g., fixed pattern noise (FPN) of pixels and/or a variation due to a difference between characteristics of logics (e.g., transistors outputting charges stored in photoelectric conversion elements of pixels) each outputting a pixel signal from a pixel. To compensate for a variation in a plurality of pixel signals output through the column lines CLs, a process of obtaining a reset voltage (or a reset component) and a sensing voltage (or a sensing component) for each pixel signal and extracting a difference (e.g., a voltage difference) between the reset voltage and the sensing voltage as a valid signal component is performed. This process is called CDS. The comparator may output a result of comparison (e.g., a comparison output) using CDS. Consequently, the CDS circuit 531 may generate the result of comparison using CDS.

The ADC circuit 533 may convert the comparison result of the CDS circuit 531 into digital data and generate and output pixel values corresponding to a plurality of pixels in row units. The ADC circuit 533 may include a plurality of counters. The counters may be respectively connected to the respective outputs of the comparators. Each counter may count a comparison result output from a comparator. A counter may count a comparison result, which is output from a comparator as logic high or logic low, based on a counting clock signal in a reset conversion period, in which a reset signal is sensed, and in an image conversion period, in which a sensing signal is sensed, and may output digital data (e.g., a pixel value) according to a counting result. The counter may include a latch circuit and an operational circuit. The latch circuit may latch a code value received as the counting clock signal at the level transition time of the comparison signal from the comparator. The latch circuit may latch a code value, e.g., a reset value, corresponding to a reset signal and a code value, e.g., an image signal value, corresponding to an image signal. The operational circuit may perform an operation on the reset value and the image signal value and thus generate an image signal value having a reset level of a pixel removed therefrom. The counter may output, as a pixel value, the image signal value having the reset level removed therefrom. However, embodiments are not limited thereto. The counter may include an operational circuit and an up-counter, which increases a count value based on a counting clock signal, or may include an up/down-counter, or a bitwise inversion counter.

The buffer 535 may store pixel values output from the ADC circuit 533. The buffer 535 may store digital data (e.g., a pixel value) of each row. In an example embodiment, the buffer 535 may temporarily store digital data output from the counter and then amplify and output the digital data. In other words, the buffer 535 may include an output buffer. The buffer 535 may temporarily store digital data output from a plurality of counters and sequentially or selectively output the digital data to a sense amplifier. The sense amplifier may amplify and output the digital data. The buffer 535 may output the image data IDAT, which has been amplified, based on the column control signal CTR_Y of a column decoder, which selects a column under the control of the controller 510.

The buffer 535 may include, for example, static random access memory (SRAM), a latch, a flip-flop, or a combination thereof, but is not limited thereto. In an example embodiment, the buffer 535 may be included, for example, as a memory, in the ADC circuit 533.

The ramp generator 550 may generate the ramp signal RMP, which gradually increases or decreases with a certain slope, and provide the ramp signal RMP to the readout circuit 530.

The monitoring circuit 560 may calculate the slope of the ramp signal RMP and discriminate whether the ramp signal RMP is normal according to whether the slope is in a normal range. The discrimination result about the ramp signal RMP may be provided to the controller 510 as the verify signal VFY. According to an example embodiment, when the verify signal VFY indicates a fault of the ramp signal RMP, the controller 510 may output the column control signal CTR_Y such that the buffer 535 restrains output of the image data IDAT and may limit the operation of the readout circuit 530, which is based on the ramp signal RMP, and stop various operation modes, which are based on the image data IDAT.

Figure 11:
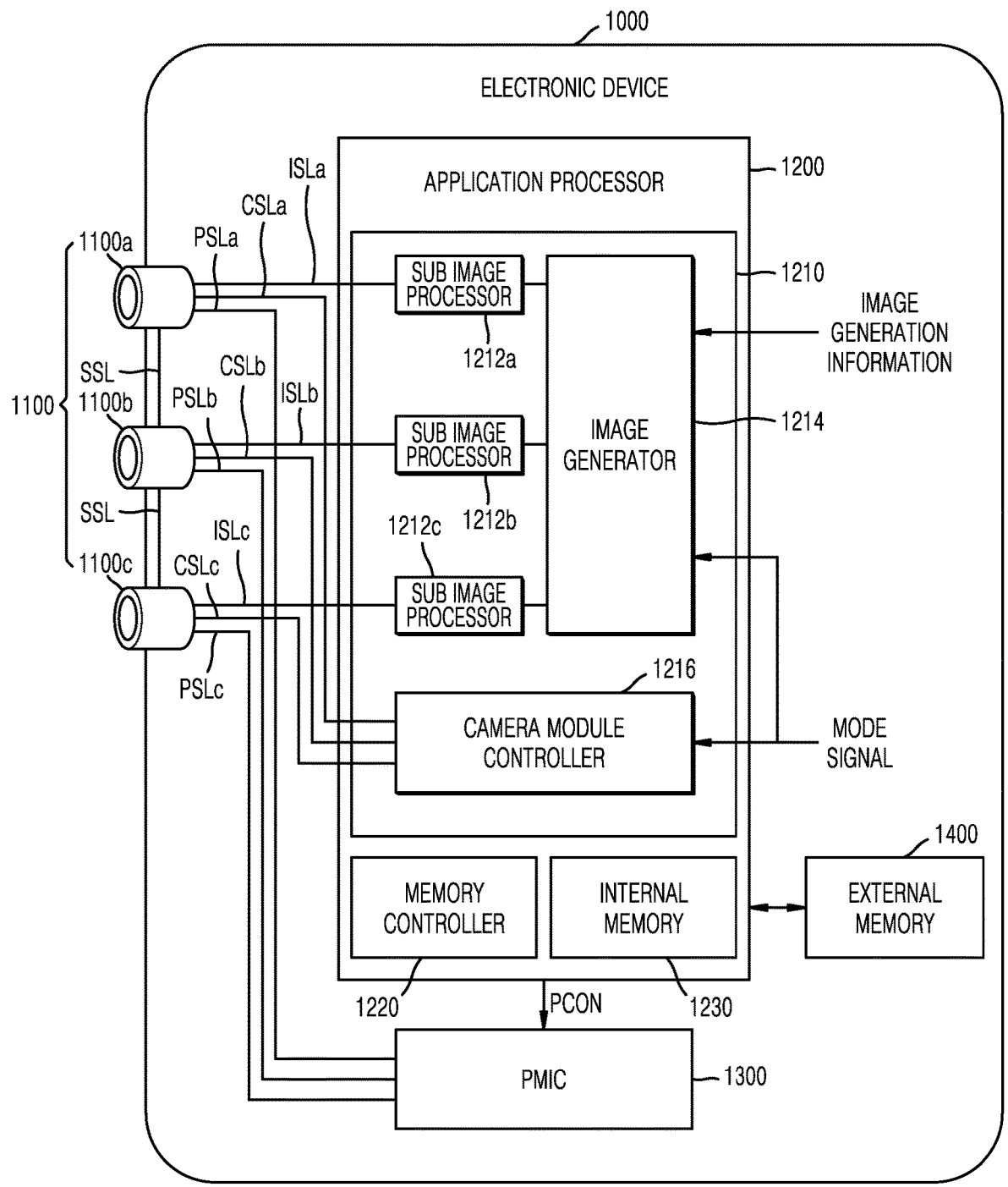
FIG. 11 is a block diagram of an electronic device including a multi-camera module using an image sensor, according to an example embodiment.
Figure 12:
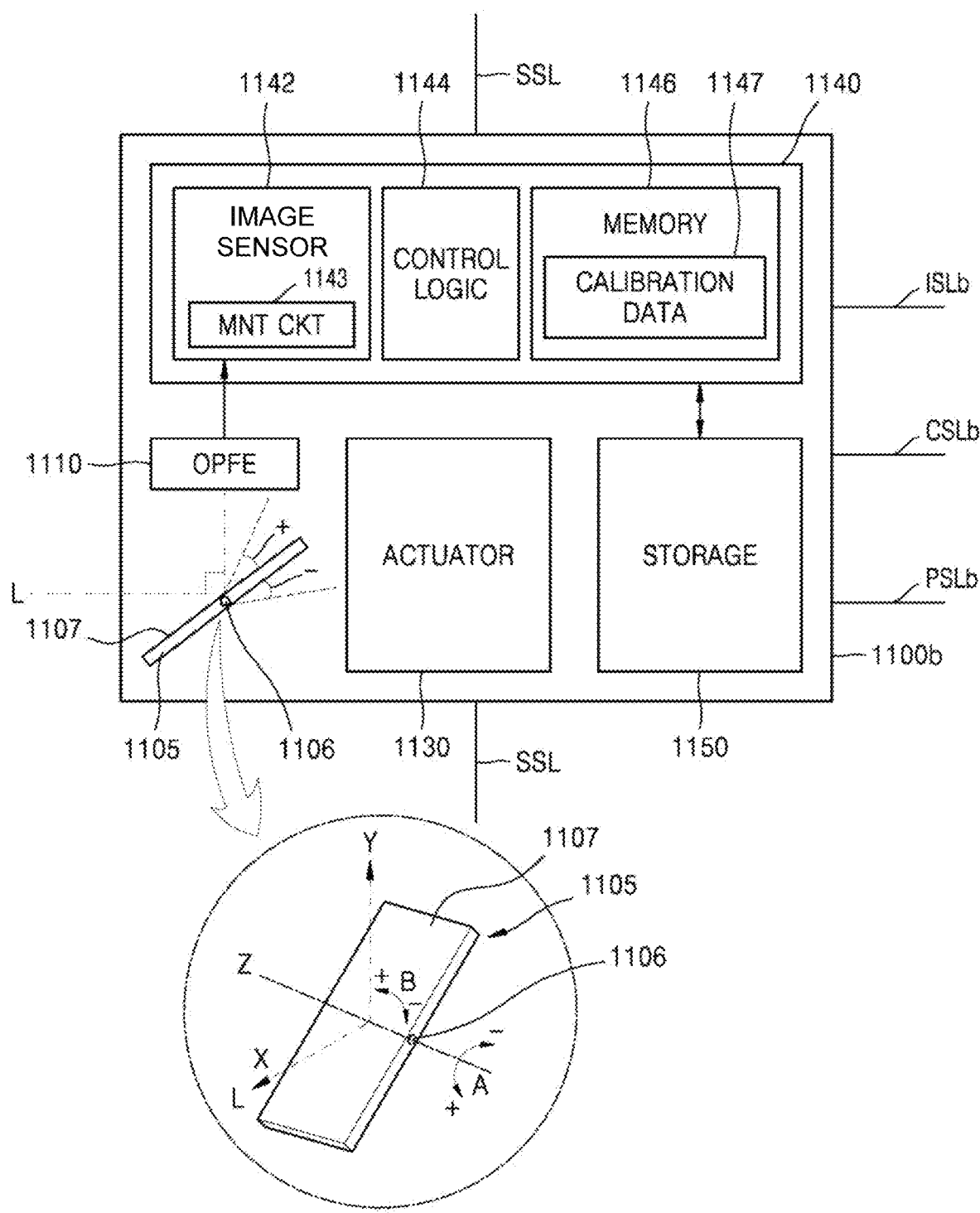
FIG. 12 is a detailed block diagram of the multi-camera module in FIG. 11 according to an example embodiment.

FIG. 11 is a block diagram of an electronic device including a multi-camera module using an image sensor, according to an example embodiment. FIG. 12 is a detailed block diagram of the multi-camera module in FIG. 11 according to an example embodiment.

Referring to FIG. 11, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 11, embodiments are not limited thereto. For example, in some embodiments, the camera module group 1100 may be modified to include only two camera modules, or the camera module group 1100 may be modified to include "n" camera modules, where "n" is a natural number of at least 4.

The detailed configuration of the camera module 1100b will be described with reference to FIG. 12 below. The descriptions below may also be applied to the other camera modules 1100a and 1100c.

Referring to FIG. 12, the camera module 1100b may include a prism 1105, an optical path folding element (OPFE) 1110, an actuator 1130, an image sensing device 1140, and a storage 1150.

The prism 1105 may include a reflective surface 1107 formed of a light reflecting material and may change the path of light L incident from outside.

In some embodiments, the prism 1105 may change the path of the light L incident in a first direction X into a second direction Y crossing (e.g., perpendicular to) the first direction X. The prism 1105 may rotate the reflective surface 1107 of the light reflecting material in a direction A around a central shaft 1106 or rotate the central shaft 1106 in a direction B so that the path of the light L incident in the first direction X is changed into the second direction Y perpendicular to the first direction X. At this time, the OPFE 1110 may move in a third direction Z, which is perpendicular to the first and second directions X and Y.

In some embodiments, an A-direction maximum rotation angle of the prism 1105 may be less than or equal to about 15 degrees in a plus (+) A direction and greater than about 15 degrees in a minus (−) A direction, but embodiments are not limited thereto.

In some embodiments, the prism 1105 may move by an angle of about 20 degrees or in a range from about 10 degrees to about 20 degrees or from about 15 degrees to about 20 degrees in a plus or minus B direction. An angle by which the prism 1105 moves in the plus B direction may be the same as or similar, within a difference of about 1 degree, to an angle by which the prism 1105 moves in the minus B direction.

In some embodiments, the prism 1105 may move the reflective surface 1107 of the light reflecting material in the third direction Z parallel with an extension direction of the central shaft 1106.

The OPFE 1110 may include, for example, "m" optical lenses, where "m" is a natural number. The "m" lenses may move in the second direction Y and change an optical zoom ratio of the camera module 1100b. For example, when the default optical zoom ratio of the camera module 1100b is Z, the optical zoom ratio of the camera module 1100b may be changed to 3Z, 5Z, or greater by moving the "m" optical lenses included in the OPFE 1110.

The actuator 1130 may move the OPFE 1110 or an optical lens to a certain position. For example, the actuator 1130 may adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may sense an image of an object using the light L provided through the optical lens.

According to an example embodiment, the image sensor 1142 may include a monitoring circuit 1143. The image sensor 1142 in FIG. 12 may be substantially the same as the image sensor 500 of FIG. 10, and the monitoring circuit 1143 in FIG. 12 may be substantially the same as the monitoring circuit 100 of FIG. 2 or the monitoring circuit 200 of FIG. 3, and thus, redundant descriptions thereof are omitted unless different from those given above.

The control logic 1144 may control general operations of the camera module 1100b. For example, the control logic 1144 may control operation of the camera module 1100b according to a control signal provided through a control signal line CSLb.

The memory 1146 may store information, such as calibration data 1147, utilized for the operation of the camera module 1100b. The calibration data 1147 may include information which is utilized for the camera module 1100b to generate image data using the light L provided from outside. For example, the calibration data 1147 may include information about the degree of rotation described above, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, the storage 1150 may include electrically erasable programmable read-only memory (EEPROM), but embodiments are not limited thereto.

Referring to FIGS. 11 and 12, in some embodiments, each of the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110 while the other camera modules (e.g., the camera modules 1100a and 1100c) may be of a vertical type that does not include the prism 1105 and the OPFE 1110. However, embodiments are not limited thereto.

In some embodiments, one (e.g., the camera module 1100c) of the camera modules 1100a, 1100b, and 1100c may include a vertical depth camera, which extracts depth information using an infrared (IR) ray. In this case, the application processor 1200 may generate a three-dimensional (3D) depth image by merging image data provided from the depth camera with image data provided from another camera module (e.g., the camera module 1100a or 1100b).

In some embodiments, at least two camera modules (e.g., 1100a and 1100b) among the camera modules 1100a, 1100b, and 1100c may have different field-of-views. In this case, the two camera modules (e.g., 1100a and 1100b) among the camera modules 1100a, 1100b, and 1100c may respectively have different optical lenses, but embodiments are not limited thereto.

In some embodiments, the camera modules 1100a, 1100b, and 1100c may have different field-of-views from one another. In this case, the camera modules 1100a, 1100b, and 1100c may respectively have different optical lenses, but embodiments are not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 11, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub image processors 1212a, 1212b, and 1212c, an image generator 1214, and a camera module controller 1216.

The image processing unit 1210 may include as many sub image processors 1212a, 1212b, and 1212c as camera modules 1100a, 1100b, and 1100c.

Image data generated from each of the camera modules 1100a, 1100b, and 1100c may be provided to a corresponding one of the sub image processors 1212a, 1212b, and 1212c through a corresponding one of image signal lines ISLa, ISLb, and ISLc, which are separated from one another. For example, image data generated from the camera module 1100a may be provided to the sub image processor 1212a through the image signal line ISLa, image data generated from the camera module 1100b may be provided to the sub image processor 1212b through the image signal line ISLb, and image data generated from the camera module 1100c may be provided to the sub image processor 1212c through the image signal line ISLc. Such image data transmission may be performed using, for example, a mobile industry processor interface (MIPI) based camera serial interface (CSI), but embodiments are not limited thereto.

In some embodiments, a single sub image processor may be provided for a plurality of camera modules. For example, differently from FIG. 11, the sub image processors 1212a and 1212c may not be separated but may be integrated into a single sub image processor, and the image data provided from the camera module 1100a or the camera module 1100c may be selected by a selection element (e.g., a multiplexer) and then provided to the integrated sub image processor.

The image data provided to each of the sub image processors 1212a, 1212b, and 1212c may be provided to the image generator 1214. The image generator 1214 may generate an output image using the image data provided from each of the sub image processors 1212a, 1212b, and 1212c according to image generation information or a mode signal.

For example, the image generator 1214 may generate the output image by merging at least portions of respective pieces of image data, which are respectively generated from the camera modules 1100a, 1100b, and 1100c having different field-of-views, according to the image generation information or the mode signal. Alternatively, the image generator 1214 may generate the output image by selecting one of the pieces of image data, which are respectively generated from the camera modules 1100a, 1100b, and 1100c having different field-of-views, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may merge the image data output from the camera module 1100a with the image data output from the camera module 1100c and may generate an output image using a merged image signal and the image data output from the camera module 1100b, which has not been used during the merging. When the zoom signal is a second signal different from the first signal, the image generator 1214 may generate an output image by selecting one of the pieces of image data respectively output from the camera modules 1100a, 1100b, and 1100c, instead of performing the merging. However, embodiments are not limited thereto, and a method of processing image data may be changed whenever necessary.

In some embodiments, the image generator 1214 may receive a plurality of pieces of image data, which have different exposure times, from at least one of the sub image processors 1212a, 1212b, and 1212c, and perform high dynamic range (HDR) processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

One (e.g., the camera module 1100b) of the camera modules 1100a, 1100b, and 1100c may be designated as a master camera according to the mode signal or the image generation signal including a zoom signal, and the other camera modules (e.g., 1100a and 1100c) may be designated as slave cameras. Such designation information may be included in a control signal and provided to each of the camera modules 1100a, 1100b, and 1100c through a corresponding one of control signal lines CSLa, CSLb, and CSLc, which are separated from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100b may operate as a master and the camera module 1100a may operate as a slave. In contrast, when the zoom factor indicates a high zoom ratio, the camera module 1100a may operate as a master and the camera module 1100b may operate as a slave.

In some embodiments, a control signal provided from the camera module controller 1216 to each of the camera modules 1100a, 1100b, and 1100c may include a sync enable signal. For example, when the camera module 1100b is a master camera and the camera module 1100a is a slave camera, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. In an example embodiment, the second speed may be at most 30 times the first speed.

The application processor 1200 may store the received image signal, e.g., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub image processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a supply voltage, to each of the camera modules 1100a, 1100b, and 1100c. For example, under the control of the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. At this time, the power control signal PCON may include information about a camera module to operate in the low-power mode and a power level to be set. The same or different levels of power may be respectively provided to the camera modules 1100$a$, 1100$b$, and 1100$c$. The level of power may be dynamically changed.

Figure 13:
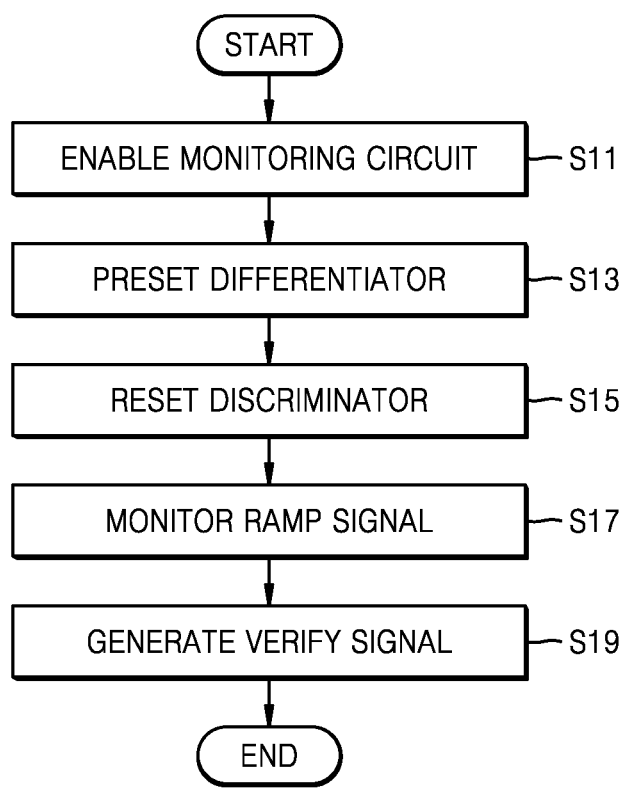
FIG. 13 is a flowchart of an operating method of an electronic device, according to an example embodiment.

FIG. 13 is a flowchart of an operating method of an electronic device, according to an example embodiment. FIGS. 1 and 3 will be referred to together with FIG. 13 below.

The electronic device may enable a monitoring circuit in operation S11. For example, the electronic device 10 of FIG. 1 may enable the monitoring circuit 15 in FIG. 1. The monitoring circuit may be enabled by power supply. For example, as the power signal PWR provided to the monitoring circuit 200 of FIG. 3 is turned on, each element of the monitoring circuit 200 may be enabled.

The electronic device may preset a differentiator in operation S13. For example, the electronic device 10 may preset the differentiator 210 in FIG. 3 by turning on the preset signal PRST provided to the differentiator 210. As the differentiator 210 is preset, the transconductance of the amplifier AMP in FIG. 3 may increase, and the transient state of the differentiator 210 may be quickly stabilized.

The electronic device may reset a discriminator in operation S15. For example, the electronic device 10 may reset the discriminator 290 in FIG. 3 by turning on the reset signal RST provided to the discriminator 290. As the discriminator 290 is reset, a discrimination operation may be performed on the first comparison output voltage $V_{CO1}$ and/or the second comparison output voltage $V_{CO2}$.

The electronic device may monitor a ramp signal in operation S17. For example, the electronic device 10 may generate the differential output voltage $V_{DO}$ as a result of calculating the slope of the ramp voltage $V_{RAMP}$ in FIG. 3 and discriminate whether the differential output voltage $V_{DO}$ is in the range of the first reference voltage $V_{REF1}$ or the second reference voltage $V_{REF2}$. The electronic device may generate the monitoring signal MNT to output a result of monitoring the ramp signal.

The electronic device may generate a verify signal in operation S19. For example, the electronic device may output the verify signal VFY during the turn-on period of the monitoring signal MNT. The verify signal VFY may be provided to a controller. For example, the controller 11 in FIG. 1 may identify whether the ramp signal RMP is faulty based on the logic level of the ramp signal RMP. When the ramp signal RMP is faulty, the controller 11 may stop the operation of the electronic device, which is based on the ramp signal RMP, or inform a user of the fault of the ramp signal RMP.

Figure 14:
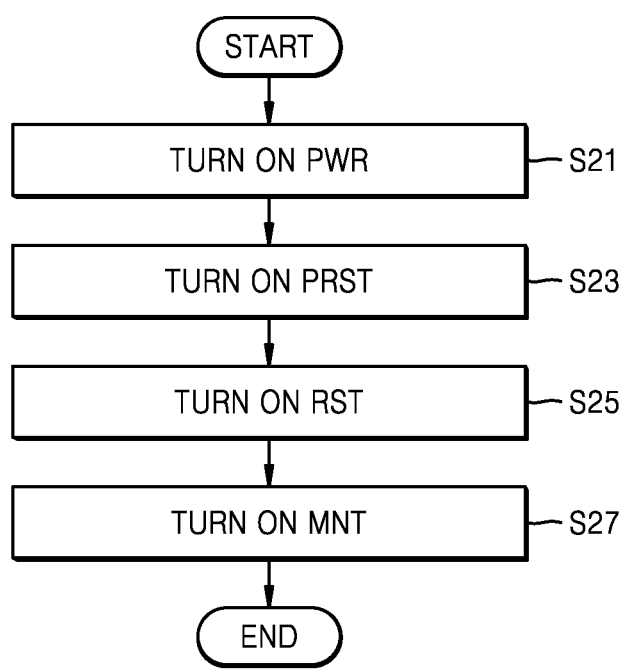
FIG. 14 is a flowchart of an operating method of an electronic device, according to an example embodiment.

FIG. 14 is a flowchart of an operating method of an electronic device, according to an example embodiment. The flowchart of FIG. 14 describes the operation of FIG. 13 in light of various signals. FIGS. 1 and 3 will be referred to together with FIG. 14.

The power signal PWR may be turned on in operation S21. As the power signal PWR is turned on, power may be supplied to each element of the monitoring circuit 200 of FIG. 3.

The preset signal PRST may be turned on in operation S23. In an example embodiment, as the preset signal PRST transitions to logic high, an input terminal of the differentiator 210 in FIG. 3 may be short-circuited. As input voltages of the amplifier AMP in FIG. 3 are substantially the same as each other, the transconductance of the amplifier AMP may increase, and the transient state of the amplifier AMP may be quickly stabilized. According to an example embodiment, the preset signal PRST may be turned on after the power signal PWR is turned on.

The reset signal RST may be turned on in operation S25. In an example embodiment, as the reset signal RST transitions to logic high, the discriminator 290 in FIG. 3 may perform a discrimination operation on the first comparison output voltage $V_{CO1}$ and/or the second comparison output voltage $V_{CO2}$. According to an example embodiment, the reset signal RST may be turned on after the preset signal PRST is turned on, but embodiments are not limited thereto. For example, in some example embodiments, the reset signal RST may be turned on before the preset signal PRST is turned on.

The monitoring signal MNT may be turned on in operation S27. In an example embodiment, as the monitoring signal MNT is turned on, the verify signal VFY corresponding to a result of discriminating the first comparison output voltage $V_{CO1}$ and/or the second comparison output voltage $V_{CO2}$ may be output. According to an example embodiment, the turn-on period of the monitoring signal MNT may be predetermined. According to an example embodiment, the monitoring signal MNT may be turned on after the reset signal RST is turned on.

Figure 15:
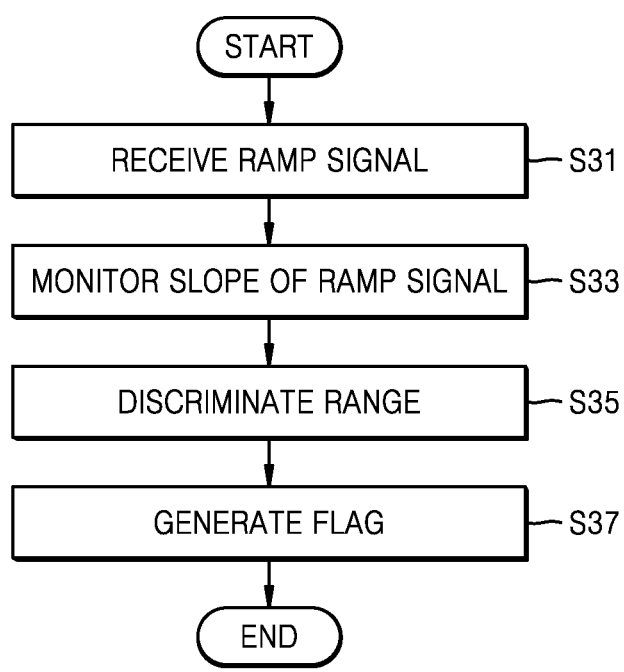
FIG. 15 is a flowchart of an operating method of a monitoring circuit, according to an example embodiment.

FIG. 15 is a flowchart of an operating method of a monitoring circuit, according to an example embodiment. The flowchart of FIG. 15 describes the operation of FIG. 13 from a functional perspective. FIGS. 1 and 3 will be referred to together with FIG. 15.

The monitoring circuit may receive a ramp signal in operation S31. According to an example embodiment, the monitoring circuit 15 in FIG. 1 may receive the ramp signal RMP from the ramp generator 13 in FIG. 1.

The monitoring circuit may monitor the slope of the ramp signal in operation S33. According to an example embodiment, the monitoring circuit 200 of FIG. 2 may calculate the slope of the ramp voltage $V_{RAMP}$ in FIG. 3 and output a calculation result as the differential output voltage $V_{DO}$.

The monitoring circuit may discriminate whether the range of the slope is in a normal range in operation S35. According to an example embodiment, the monitoring circuit 200 may compare a voltage level corresponding to the calculated slope with each of the first reference voltage $V_{REF1}$ and the second reference voltage $V_{REF2}$. For example, the monitoring circuit 200 may discriminate whether the differential output voltage $V_{DO}$ is in the range of the first reference voltage $V_{REF1}$ or the second reference voltage $V_{REF2}$. For example, the discriminator 290 in FIG. 3 may identify whether the first comparison output voltage $V_{CO1}$ and/or the second comparison output voltage $V_{CO2}$ is positive or negative.

The monitoring circuit may generate a flag in operation S37. According to an example embodiment, the monitoring circuit 200 may generate a flag, which indicates whether the ramp signal RMP is normal or faulty, as an example of the verify signal VFY.

Figure 16:
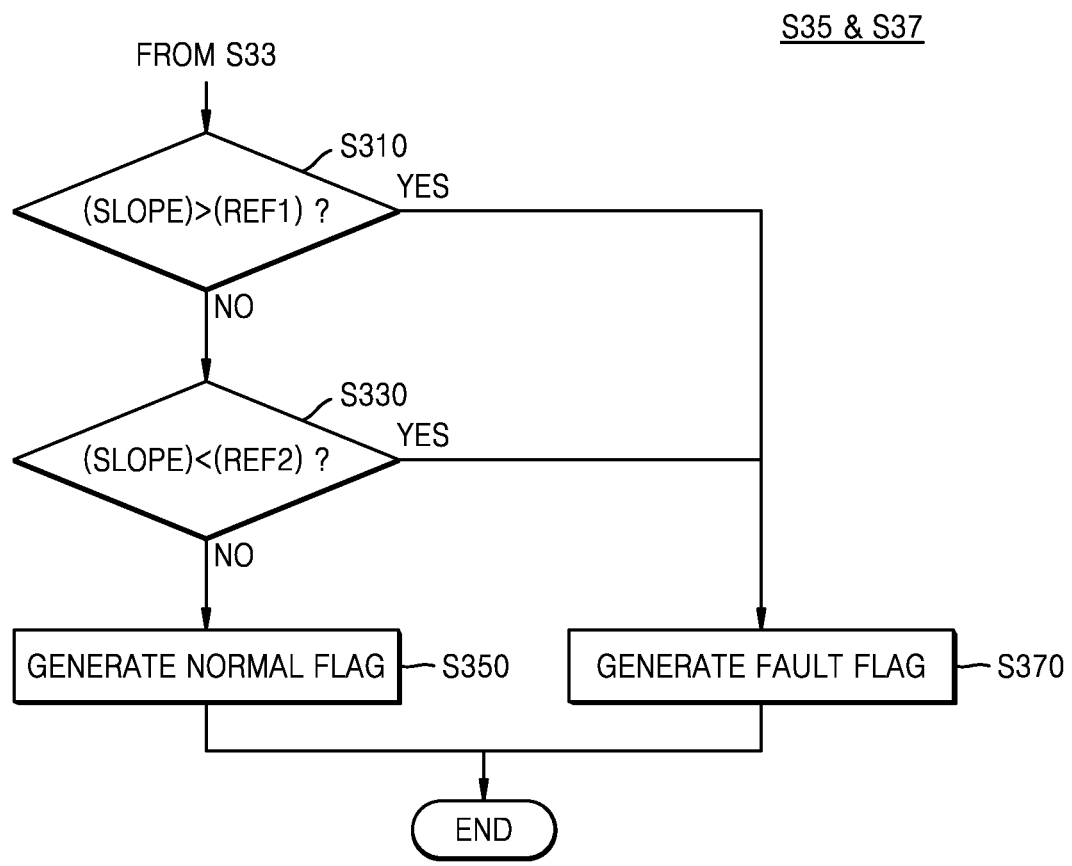
FIG. 16 is a detailed flowchart of operations S35 and S37 in FIG. 15, according to an example embodiment.

FIG. 16 is a detailed flowchart of operations S35 and S37 in FIG. 15, according to an example embodiment.

After operation S33, whether the slope of the ramp signal is greater than the first reference value REF1 may be determined in operation S310. When the slope is not greater than the first reference value REF1 (in case of NO), operation S330 is performed. When the slope is greater than the first reference value REF1 (in case of YES), operation S370 is performed.

Whether the slope of the ramp signal is less than the second reference value REF2 may be determined in operation S330. When the slope is not less than the second reference value REF2 (in case of NO), operation S350 is performed. When the slope is less than the second reference value REF2, operation S370 is performed.

A normal flag may be generated in operation S350. In an example embodiment, as the slope of the ramp signal RMP is less than the first reference value REF1 and greater than the second reference value REF2, the discriminator 290 in FIG. 3 may generate the normal flag indicating that the ramp signal RMP is normal.

A fault flag may be generated in operation S370. In an example embodiment, as the slope of the ramp signal RMP is greater than the first reference value REF1 or less than the second reference value REF2, the discriminator 290 in FIG. 3 may generate a fault flag indicating that the ramp signal RMP is faulty.

Figure 17:
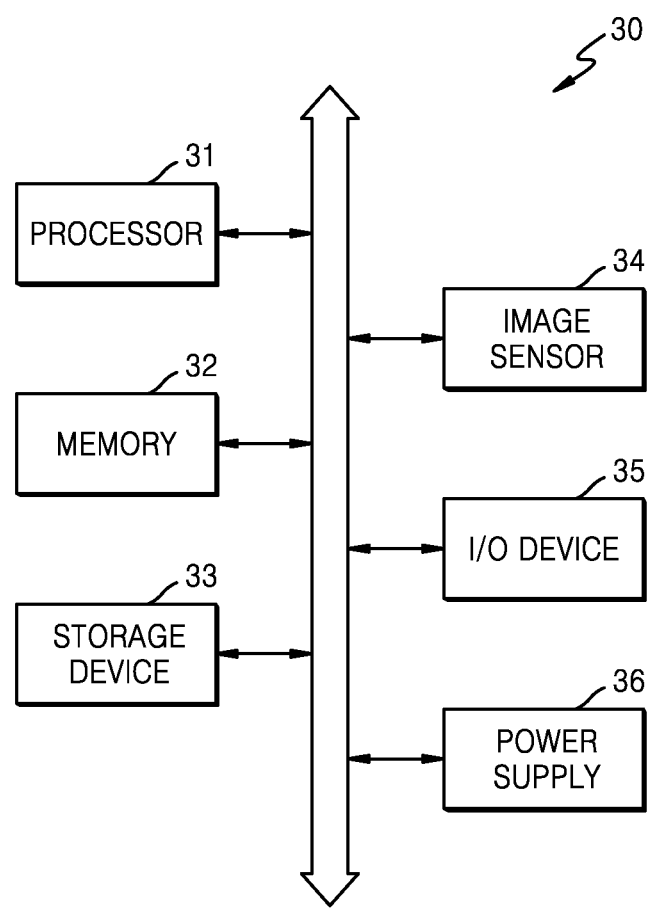
FIG. 17 is a block diagram of an electronic device according to an example embodiment.

FIG. 17 is a block diagram of an electronic device 30 according to an example embodiment. Referring to FIG. 17, the electronic device 30 may include a processor 31, a memory 32, a storage device 33, an image sensor 34, an input/output (I/O) device 35, and a power supply 36, which may communicate with one another through a bus. The image sensor 500 of FIG. 10 may be applied to the image sensor 34 in FIG. 17, and thus, redundant descriptions thereof are omitted.

The processor 31 may perform particular calculations or tasks necessary for the operation of the electronic device 30. The memory 32 and the storage device 33 may store data necessary for the operation of the electronic device 30. For example, the processor 31 may include a microprocessor, a CPU, or an application processor (AP). The memory 32 may include volatile memory and/or non-volatile memory. The storage device 33 may include, for example, a solid state drive (SSD), a hard disk drive (HDD), or CD-ROM.

The I/O device 35 may include, for example, an input unit, such as a keyboard, a keypad, or a mouse, and an output unit such as a printer or a display. The power supply 36 may supply an operating voltage necessary for the operation of the electronic device 30.

Figure 18:
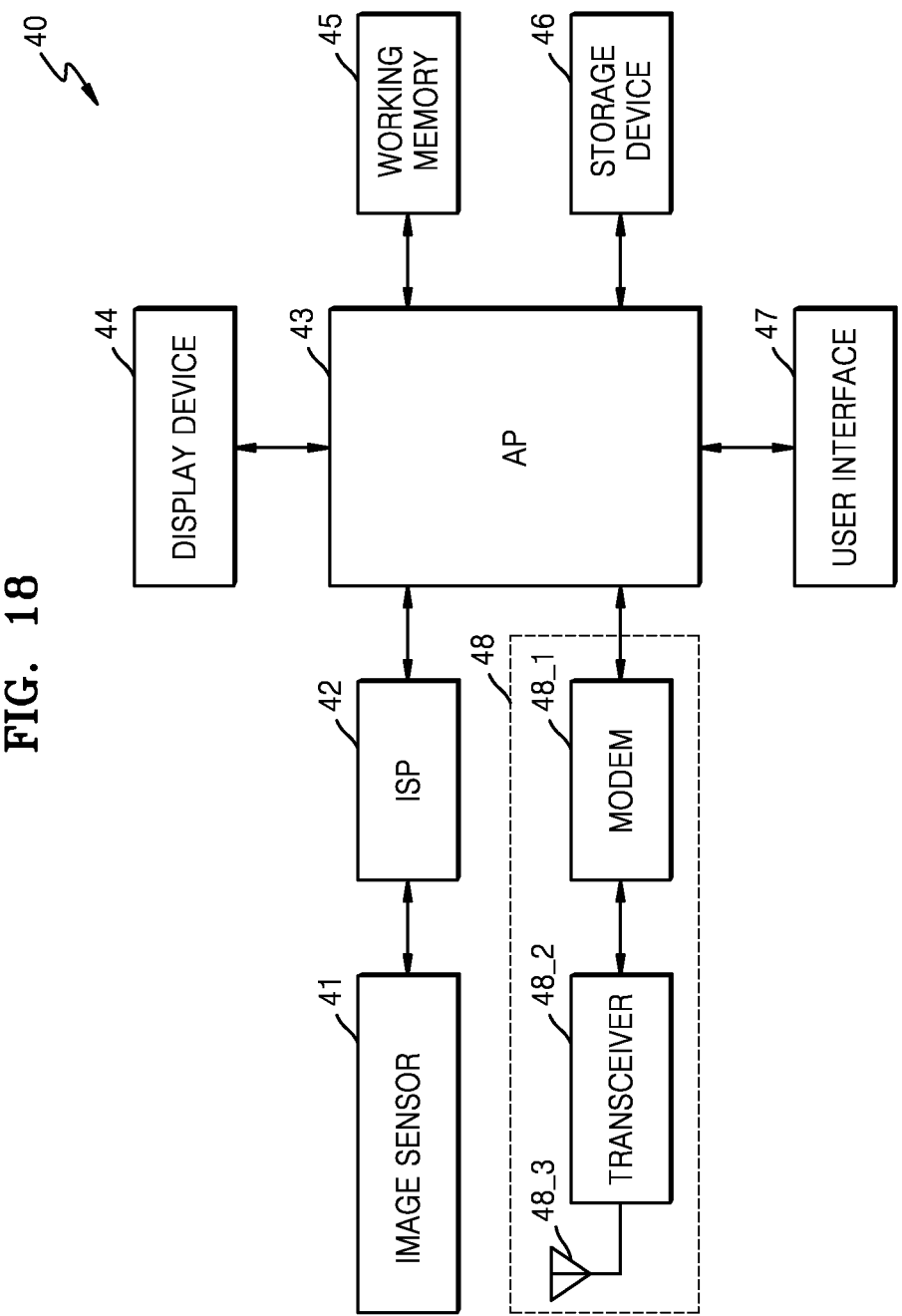
FIG. 18 is a block diagram of an electronic device according to an example embodiment.

FIG. 18 is a block diagram of an electronic device 40 according to an example embodiment.

Referring to FIG. 18, the electronic device 40 may include an image sensor 41, an image signal processor (ISP) 42, an AP 43, a display device 44, a working memory 45, a storage device 46, a user interface 47, and a wireless transceiver 48. The image sensor 500 of FIG. 10 may operate as the image sensor 41 in FIG. 17, and thus, redundant descriptions thereof are omitted.

The image sensor 41 may generate image data, e.g., raw image data, based on a received optical signal and provide binary data to the ISP 42. The ISP 42 may perform image processing on the image data IDAT, which is digital data about an image, to change a data format (e.g., to change a Bayer pattern into a YUV format or an RGB format) or image processing, such as, for example, denoising, brightness adjustment, and/or sharpness adjustment, for enhancing image quality. In an example embodiment, the ISP 42 may perform preprocessing, such as, for example, white balancing, denoising, demosaicking, lens shading, gamma correction, edge detection, sharpness enhancement, noise reduction, gain tuning, waveform shaping, interpolation, edge enhancement, or binning, to remove distortion from the image data IDAT and increase algorithm performance. As the image data IDAT is pre-processed by the ISP 42, the speed of post-processing of the image data IDAT may be increased. In an example embodiment, the ISP 42 may be provided outside the image sensor 41 for spatial efficiency or provided inside the image sensor 41 to increase a processing speed. For convenience of description, the ISP 42 is provided separately from the AP 43, but embodiments are not limited thereto. For example, in an example embodiment, the ISP 42 may be configured not by separate hardware or a combination of hardware and software, but as an element of the AP 43.

The AP 43 may be provided as a system-on-chip (SoC), which generally controls operations of the electronic device 40 and runs an application program, an operating system, or the like. The AP 43 may control the operation of the ISP 42 and may provide converted image data generated by the ISP 42 to the display device 44 or store the converted image data in the storage device 46.

The working memory 45 may store programs and/or data, which are processed or executed by the AP 43. The storage device 46 may include non-volatile memory such as, for example, NAND flash memory or resistive memory. For example, the storage device 46 may be provided as a memory card such as a multimedia card (MMC), an embedded MMC (eMMC), a secure digital (SD) card, or a micro SD card. The storage device 46 may store data and/or a program, which is related to an execution algorithm controlling the image processing operation of the ISP 42. The data and/or the program may be loaded to the working memory 45 when the image processing operation is performed. For example, the working memory 45 or the storage device 46 may include, as non-volatile memory, read-only memory (ROM), flash memory, phase-change random access memory (RAM) (PRAM), magnetic RAM (MRAM), resistive RAM (RRAM), ferroelectric RAM (FRAM), or the like and, as volatile memory, static RAM (SRAM), dynamic RAM (DRAM), or the like, but is not limited thereto.

The user interface 47 may include various devices, such as, for example, a keyboard, a button key panel, a touch panel, a fingerprint sensor, and a microphone, which may receive a user input. The user interface 47 may receive a user input and provide a signal corresponding to the user input to the AP 43. The wireless transceiver 48 may include a modem 48_1, a transceiver 48_2, and an antenna 48_3.

Figure 19:
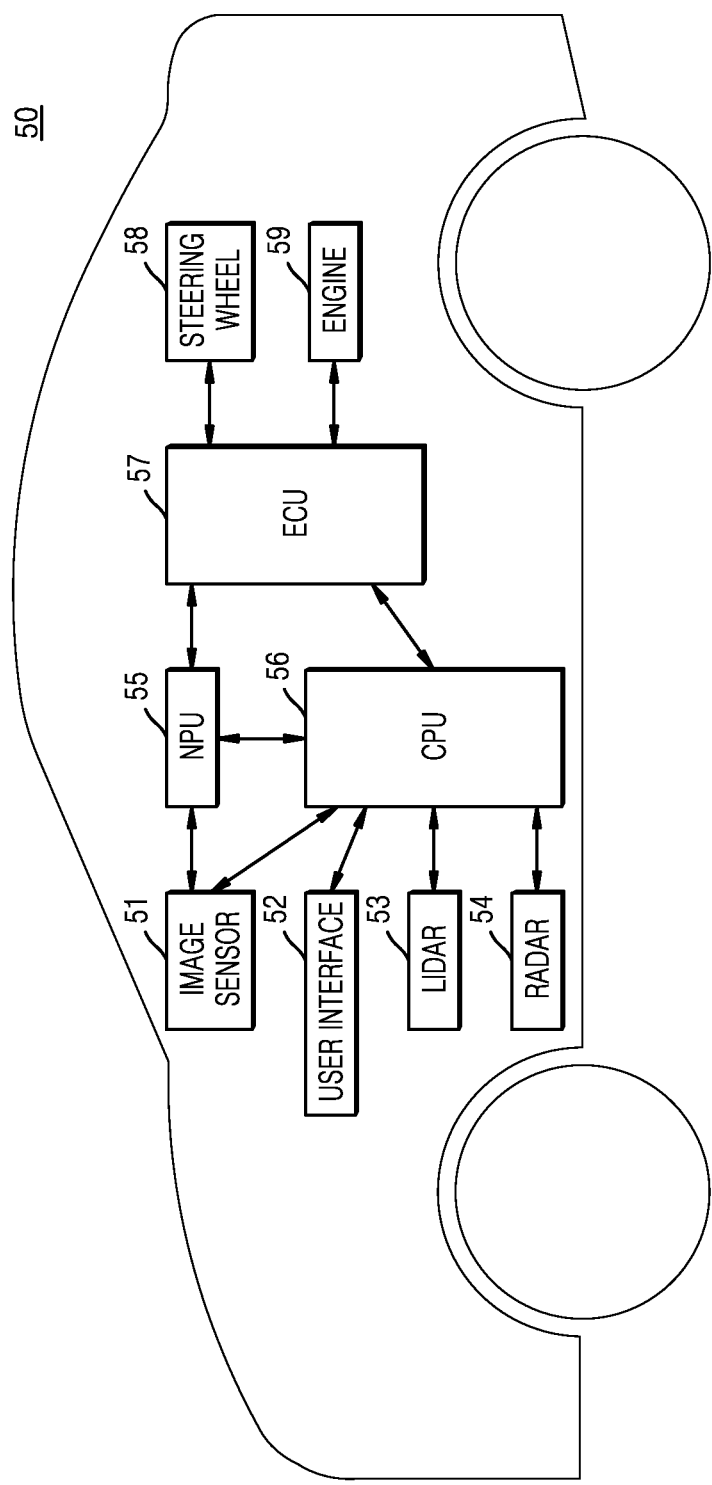
FIG. 19 is a block diagram of a vehicle using a ramp signal, according to an example embodiment.

FIG. 19 is a block diagram of a vehicle 50 using the ramp signal RMP, according to an example embodiment.

The vehicle 50 of FIG. 19 may be an example implementation of the electronic device 10 of FIG. 1. Alternatively, the vehicle 50 may be driven using an electronic system including the electronic device 10.

According to an example embodiment, the vehicle 50 may support an autonomous driving mode. The autonomous driving mode maybe supported using the electronic device 10 described above. Hereinafter, the vehicle 50 may sense an object or perform sampling using the ramp signal RMP or provide various electronic functions based on the ramp signal RMP. It may be construed that the descriptions given above about an electronic device, an image sensor, and a monitoring circuit are applied to the vehicle 50 of FIG. 19.

Referring to FIG. 19, the vehicle 50 using the ramp signal RMP may include an image sensor 51, a user interface 52, a light detection and ranging (LIDAR) sensor 53, a radio detection and ranging (RADAR) sensor 54, a neural processing unit (NPU) 55, a CPU 56, and an ECU 57. The ECU 57 may receive a steering angle of the vehicle 50 and a speed of the vehicle 50 from a steering wheel 58 and an engine 59. In an example embodiment, the vehicle 50 may further include a communication module, an I/O module, a security module, a power control unit, or the like, and may further include various kinds of control units.

According to example embodiment, the vehicle 50 may detect an object using information about external environments, which is obtained through sensors (e.g., the image sensor 51, the LIDAR sensor 53, and/or the RADAR sensor 54). The sensors, e.g., the image sensor 51, the LIDAR sensor 53, and the RADAR sensor 54, may capture an object, measure a distance to the object, and provide the distance to processors (e.g., the CPU 56, the NPU 55, and the ECU 57). To detect an object, the sensors, e.g., the image sensor 51, the LIDAR sensor 53, and the RADAR sensor 54, may use the ramp signal RMP. The ramp signal RMP provides a signal that gradually increases or decreases with a certain magnitude such that a signal or data of a sensed object may be sampled, and sampled signal or data in analog form may be converted into digital information. In addition to the sensors described above, a time-of-flight (ToF) sensor, an ultrasonic sensor, an infrared sensor, a magnetic sensor, a position sensor (e.g., a global positioning system (GPS)), an acceleration sensor, an atmospheric pressure sensor, a temperature/humidity sensor, a proximity sensor, and/or a gyroscope sensor may also be used. The function of each sensor may be intuitively deduced by one of skill in the art from the name thereof, and thus, detailed descriptions thereof will be omitted.

The image sensor 51 may sense an image or light and include a complementary metal-oxide-semiconductor (CMOS) image sensor. The image sensor 51 may provide image or visual information of an object. For example, the image sensor 51 may be attached to the front of the vehicle 50 and capture a driving image or measure a distance to an object in front of the vehicle 50. A position to which the image sensor 51 is attached is not limited to that described above and may be various such that an intended goal of acquiring information about an object is accomplished.

The image sensor 51 may capture the surroundings of the vehicle 50. The vehicle 50 may include at least two image sensors to capture the surroundings in all directions at 360 degrees. In an example embodiment, the image sensor 51 may include a wide-angle lens. In an example embodiment, the vehicle 50 may include four image sensors in the front, back, left side, and right side thereof, but embodiments are not limited thereto. The surroundings of the vehicle 50 may be captured using a single image sensor. The image sensor 51 may continuously capture the surroundings of the vehicle 50 and continuously provide the vehicle 50 with information about the surroundings.

An image sensed by the image sensor 51 may be processed by the CPU 56 and/or the NPU 55. The CPU 56 may detect an object by processing the sensed image using a motion-based method, and the NPU 55 may detect an object by processing the sensed image using a form-based method. The image sensor 51 may be attached to the front of the vehicle 50 and sense an external environment in front of the vehicle 50, but is not limited thereto. The image sensor 51 may be attached to various sides of the vehicle 50.

The user interface 52 may include various electronic devices and mechanical devices, such as, for example, a dashboard, a display showing driving information, a navigation device, and an air conditioning system, in a driver's seat or a front passenger seat.

The LIDAR sensor 53 may emit laser pulses, receive the laser pulses reflected from an object, and measure a distance to the object. The LIDAR sensor 53 may include, for example, a laser, a scanner, a receiver, and a positioning system. For the laser, light having a wavelength range of about 600 nanometers (nm) to about 1000 nm may be used according to example embodiments, but example embodiments are not limited thereto. For example, in some example embodiments, the wavelength range of the light may be different according to the use of the laser. The scanner may quickly acquire information about surroundings by scanning the sensed surroundings. There may be different types of scanners using a plurality of mirrors. The receiver may receive laser pulses reflected from an object and detect and amplify photons in the laser pulses. The positioning system may identify the location coordinates and direction of a device, which includes a receiver, to realize a 3D image. The LIDAR sensor 53 and the RADAR sensor 54 may be distinguished from each other by an effective measurement range.

The RADAR sensor 54 may emit an electromagnetic wave, receive the electromagnetic wave reflected from an object, and measure a distance to the object or identify the object and measure the position and moving speed of the object. The RADAR sensor 54 may include a transmitter and a receiver. The transmitter may generate and output an electromagnetic wave, and the receiver may receive a wave reflected from an object and process a signal. Transmission and reception may be performed through a single antenna in the RADAR sensor 54, but embodiments are not limited thereto. The frequency band of an electromagnetic wave of the RADAR sensor 54 may correspond to a radio wave or a microwave, but may be changed according to the purpose of the RADAR sensor 54. In an example embodiment, the LIDAR sensor 53 and the RADAR sensor 54 may be attached to the vehicle 50 to assist determination on a positional relation between the vehicle 50 and an object of interest. The RADAR sensor 54 may be classified into a long-range radar sensor and a short-range radar sensor.

The NPU 55 may receive input data, perform an operation using an artificial neural network, and provide output data based on an operation result. The NPU 55 may include a processor, which may be optimized to simultaneous matrix operations, and may process multiple operations in real time, learn by itself based on accumulated data, and derive an optimal value. The NPU 55 may be optimized to simultaneous matrix operations and thus process multiple operations in real time and may learn by itself based on accumulated data and derive a local maximum from current driving parameters.

In an example embodiment, the NPU 55 may include a specialized processor to perform deep learning algorithms. For example, the NPU 55 may perform an operation process based on various types of networks such as a convolution neural network (CNN), a region with convolution neural network (R-CNN), a region proposal network (RPN), a recurrent neural network (RNN), a fully convolutional network, a long short-term memory (LSTM) network, and a classification network. However, embodiments are not limited thereto. Various kinds of operation processes modeling a human neural network may be implemented.

The NPU 55 may receive a driving image from the image sensor 51 and perform a form-based object detection based on the driving image. The NPU 55 may extract features of a plurality of objects and learn by itself based on accumulated data, and thus identify the objects in a driving image. For example, the NPU 55 may extract objects, such as, for example, vehicles, pedestrians, traffic lights, and road lines, which are criteria for decision during driving, based on features determined using accumulated data as learning materials.

The CPU 56 generally controls operations of the vehicle 50. The CPU 56 may include a single-core processor or a multi-core processor. The CPU 56 may process or execute programs and/or data stored in a memory. For example, the CPU 56 may control the functions of the NPU 55 and the ECU 57 by executing programs stored in a memory.

The CPU 56 may acquire a steering angle and a speed of the vehicle 50 from the ECU 57. The steering angle may be determined by a user's handling of the steering wheel 58 and processed by the ECU 57, which controls the operation of a steering control device, and then provided to the CPU 56. The speed of the vehicle 50 may be measured based on at least one selected from a driver's pedaling (e.g., the operation of an accelerator), the rotation speed of the engine 59, and a wheel speed measured by a wheel sensor, and may be processed by the ECU 57, which controls the speed of the vehicle 50, and then provided to the CPU 56.

The CPU 56 may determine a positional relation between the vehicle 50 and a neighboring vehicle and issue a command to maintain the revolutions per minute (RPM) of the engine 59 for cruise control for maintaining a certain distance to the neighboring vehicle according to a preset driving plan. To perform evasive steering when the distance between the vehicle 50 and the neighboring vehicle is less than or equal to a threshold distance or in the case of a cut-in object, the CPU 56 may issue a command to change a steering angle by adjusting the steering wheel 58 to the left or the right. Although it is illustrated in FIG. 19 that the steering wheel 58 and the engine 59 are related with the steering angle and the vehicle speed, embodiments are not limited thereto. The steering angle and the vehicle speed may be determined via various parts of the vehicle 50.

The CPU 56 may detect an object in a driving image using a motion-based method. In the motion-based method, the amount of motion of an object over time is detected and a relative motion is determined. A driving image may be continuously acquired frame by frame through the image sensor 51. For example, a frame may be captured at a speed of 60 frames per second (fps), and accordingly, the CPU 56 may detect a motion in frames, which are acquired at intervals of ⅟₆₀ second, over time. The motion-based method may include an optical flow indicating the distribution of motion vectors of an object.

The CPU 56 may stably maintain a driving state of the vehicle 50 complementarily using a distance to an object, which is acquired from the LIDAR sensor 53 and the RADAR sensor 54, in addition to the image sensor 51. The CPU 56 may also issue a command to control the internal/external state of the vehicle 50 according to a driver's operation on the user interface 52.

The ECU 57 may be provided to entirely or partially control the operation of the vehicle 50. The ECU 57 may control the operation of a combustion engine, the operation of at least one electric motor, and the operation of the vehicle 50 via a controller area network (CAN) multiplexing bus according to a semi-automatic gearbox (SAGB) or an automatic gearbox (AGB) and other parameters of the vehicle 50 involved in a driver's control.

The ECU 57 may electronically control, for example, the engine 59 of the vehicle 50, an actuator of a steering control device, a transmission control system, an anti-lock brake system, an airbag control system, and the like via a computer and provide the vehicle 50 with a vehicle speed based on the rotation speed of the engine 59 or a wheel speed measured by a wheel sensor and provide the vehicle 50 with a steering angle from the steering control device.

According to an example embodiment, the ECU 57 may control the states of the steering wheel 58 and the engine 59 based on commands issued by the CPU 56 and the NPU 55. In an example embodiment, the ECU 57 may decelerate or accelerate the vehicle 50 according to commands issued by the CPU 56 and the NPU 55 and provide the engine 59 with a signal for decreasing or increasing the rotation speed of the engine 59 for deceleration or acceleration. The ECU 57 may also change the steering wheel 58 to the left or the right for evasive steering when a distance to a neighboring vehicle is less than or equal to a threshold distance or in the case of a cut-in object, according to a preset driving plan.

According to an example embodiment, the CPU 56 or the ECU 57 may identify a fault of the ramp signal RMP and exit the autonomous driving mode of the vehicle 50. For example, the CPU 56 or the ECU 57 may identify a fault of the ramp signal RMP while the vehicle 50 is driving in the autonomous driving mode based on the image sensor 51 and immediately convert the autonomous driving mode into the manual driving mode, and accordingly, user safety may be promoted. For example, the vehicle 50 may identify a fault of the ramp signal RMP and stop a driving assist function, which is based on the ramp signal RMP, and accordingly, a driver's safety may be ensured.

The ECU 57 is provided separately from the CPU 56 in FIG. 19, but is not limited thereto. The vehicle control function of the ECU 57 may be included in the CPU 56. In this case, the CPU 56 may include at least two cores. Although the ECU 57 is separate from the CPU 56 in FIG. 19, embodiments are not limited thereto. For example, in example embodiments, the ECU 57 may be inside the CPU 56.

In an example embodiment, as shown in FIG. 19, the vehicle 50 may further include a communication module. The communication module may transmit data to or receive data from outside of the vehicle 50. For example, the communication module may communicate with an external object outside the vehicle 50. In this case, the communication module may perform communication using vehicle-to-everything (V2X). For example, the communication module may perform communication using vehicle-to-vehicle (V2V), vehicle-to-infra (V2I), vehicle-to-pedestrian (V2P), and vehicle-to-nomadic devices (V2N). However, embodiments are not limited thereto. The communication module may transmit and receive data using various known communication methods. For example, the communication module may perform communication using third-generation (3G), fourth-generation (4G) (e.g., long-term evolution (LTE)), fifth-generation (5G), Wi-Fi, Bluetooth, Bluetooth low energy (BLE), Zigbee, near field communication (NFC), ultrasonic communication, or the like and may cover both short-range communication and long-range communication.

As is traditional in the field of the present inventive concept, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood that various changes in form and detail may be made therein without departing from the spirit and scope of the present inventive concept as defined by the following claims.

What is claimed is:

1. An electronic device, comprising:
   a ramp generator configured to generate a ramp signal used to detect data, the ramp signal increasing or decreasing with a certain slope;
   a main circuit configured to perform at least one predefined function by detecting the data based on the ramp signal;
   a monitoring circuit configured to output a verify signal indicating whether the ramp signal is faulty; and
   a controller configured to control execution of the at least one predefined function based on the verify signal,
   wherein the monitoring circuit comprises:
      a reference generator configured to generate at least one reference value;
      a differentiator configured to calculate a slope of the ramp signal based on the ramp signal and a zeroth reference value provided from the reference generator;
      a first comparator configured to generate a first comparison result by comparing the slope with a first reference value;
      a second comparator configured to generate a second comparison result by comparing the slope with a second reference value; and
      a discriminator configured to discriminate whether the ramp signal is faulty based on the first comparison result and the second comparison result.

2. The electronic device of claim 1, wherein the first comparator, the second comparator, the differentiator, and the discriminator receive a power signal,
   the differentiator further receives a preset signal, and
   the discriminator further receives a reset signal and a monitoring signal.

3. The electronic device of claim 2, wherein the discriminator is further configured to perform an operation on the first comparison result and the second comparison result based on the reset signal.

4. The electronic device of claim 3, wherein the discriminator is further configured to output an operational value based on the monitoring signal, the operational value corresponding to a result of performing the operation on the first comparison result and the second comparison result.

5. The electronic device of claim 2, wherein the ramp signal comprises a reset ramping period corresponding to a reset operation and a signal ramping period corresponding to a signal sensing operation, and
   the power signal is turned on in one of the reset ramping period and the signal ramping period.

6. The electronic device of claim 2, wherein the differentiator is further configured to control a transconductance thereof based on the preset signal.

7. The electronic device of claim 2, wherein the preset signal transitions to a first logic level after the power signal is turned on,
   the reset signal transitions to the first logic level after the preset signal transitions to a second logic level, and
   the monitoring signal is turned on after the reset signal transitions to the second logic level.

8. The electronic device of claim 1, wherein the differentiator comprises two input terminals and a first transistor,
   wherein the first transistor is configured to connect the two input terminals to each other.

9. The electronic device of claim 8, wherein the first transistor increases a transconductance of the differentiator by connecting the two input terminals to each other.

10. The electronic device of claim 1, wherein the first reference value corresponds to a normal upper limit of the ramp signal, and
    the second reference value corresponds to a normal lower limit of the ramp signal.

11. The electronic device of claim 10, wherein the first reference value is substantially equal to double of a normal slope of the ramp signal.

12. The electronic device of claim 10, wherein the second reference value is substantially equal to ½ of a normal slope of the ramp signal.

13. The electronic device of claim 1, wherein the differentiator is further configured to differentiate the ramp signal with respect to time.

14. The electronic device of claim 1, wherein the main circuit comprises an analog-to-digital converter circuit.

15. The electronic device of claim 1, wherein the at least one predefined function comprises an autonomous driving mode of a vehicle.

16. An image sensor, comprising:
    a pixel array comprising a plurality of pixels;
    a ramp generator configured to generate a ramp signal;
    a readout circuit configured to compare the ramp signal with a pixel signal output from the pixel array and convert the pixel signal into a digital pixel value;
    a controller configured to control the ramp generator and the readout circuit; and
    a monitoring circuit configured to measure a slope of the ramp signal and output a signal indicating whether the ramp generator is faulty to the controller,
    wherein the monitoring circuit comprises:
       a reference generator configured to generate at least one reference value;
       a differentiator configured to calculate the slope of the ramp signal;
       at least one comparator configured to generate a comparison result by comparing the slope of the ramp signal with the at least one reference value; and
       a discriminator configured to discriminate whether the ramp signal is faulty based on the comparison result of the at least one comparator.

17. The image sensor of claim 16, wherein the differentiator comprises two input terminals and a first transistor,
    wherein the first transistor is configured to connect the two input terminals to each other.

* * * * *